United States Patent
Wakita et al.

(12)

(10) Patent No.: US 9,464,218 B2
(45) Date of Patent: Oct. 11, 2016

(54) (METH)ACRYLATE POLYMER, A RESIN COMPOSITION AND A SHAPED ARTICLE

(71) Applicant: MITSUBISHI RAYON CO., LTD., Minato-ku (JP)

(72) Inventors: Tsuneki Wakita, Otake (JP); Toshihiro Kasai, Otake (JP)

(73) Assignee: MITSUBISHI RAYON CO., LTD., Minato-ku (JP)

( * ) Notice: Subject to any disclaimer, the term of this patent is extended or adjusted under 35 U.S.C. 154(b) by 0 days.

(21) Appl. No.: 14/811,214

(22) Filed: Jul. 28, 2015

(65) Prior Publication Data

US 2016/0024355 A1    Jan. 28, 2016

Related U.S. Application Data

(62) Division of application No. 13/255,726, filed as application No. PCT/JP2010/053832 on Mar. 9, 2010, now abandoned.

(30) Foreign Application Priority Data

Mar. 10, 2009  (JP) .................. 2009-056122
Oct. 29, 2009  (JP) .................. 2009-248931

(51) Int. Cl.
| | |
|---|---|
| C09J 163/00 | (2006.01) |
| C09J 133/08 | (2006.01) |
| C09J 133/10 | (2006.01) |
| C08L 63/00 | (2006.01) |
| C08L 33/08 | (2006.01) |
| C08L 33/10 | (2006.01) |
| C08F 265/06 | (2006.01) |
| C08L 51/00 | (2006.01) |
| C09J 151/00 | (2006.01) |
| H01L 23/29 | (2006.01) |
| C08F 220/18 | (2006.01) |

(52) U.S. Cl.
CPC ............ *C09J 163/00* (2013.01); *C08F 265/06* (2013.01); *C08L 51/003* (2013.01); *C08L 63/00* (2013.01); *C09J 151/003* (2013.01); *H01L 23/293* (2013.01); *C08F 2220/1858* (2013.01); *H01L 2924/0002* (2013.01); *H01L 2924/12044* (2013.01); *H01L 2924/3011* (2013.01); *Y10T 428/2982* (2015.01)

(58) Field of Classification Search
None
See application file for complete search history.

(56) References Cited

U.S. PATENT DOCUMENTS

| | | | |
|---|---|---|---|
| 5,290,857 | A | 3/1994 | Ashida et al. |
| 2005/0239949 | A1 | 10/2005 | Nakamura et al. |
| 2009/0018248 | A1 | 1/2009 | Pirri et al. |

FOREIGN PATENT DOCUMENTS

| | | |
|---|---|---|
| JP | 05 065391 | 3/1993 |
| JP | 05 214310 | 8/1993 |
| JP | 2000 248142 | 9/2000 |
| JP | 2004 315572 | 11/2004 |
| JP | 2007 326997 | 12/2007 |
| WO | 03 072621 | 9/2003 |

OTHER PUBLICATIONS

Translation of JP 2007-326997 (no date).*
International Search Report Issued Jun. 15, 2010 in PCT/JP10/053832 Filed Mar. 9, 2010.
Machine Translation of JP 2007-326997, provided by the JPO website (no date).

* cited by examiner

*Primary Examiner* — Michael J Feely
(74) *Attorney, Agent, or Firm* — Oblon, McClelland, Maier & Neustadt, L.L.P.

(57) ABSTRACT

Disclosed is a (meth)acrylate polymer having a volume average primary particle size of 0.520 to 3.00 μm, a peak temperature of tan δ in the range of −100 to 0° C., determined with dynamic viscoelasticity measurement, of −40° C. or below, a peak height of tan δ in the range of −100 to 0° C., determined with dynamic viscoelasticity measurement, of 0.300 or more, and an acetone-insoluble component of 99% by mass of more.
This polymer has excellent dispersibility of primary particles in a resin, excellent storage stability of a resin composition obtained, and excellent insulating properties and reduction in elastic modulus of a molded article obtained.

11 Claims, 2 Drawing Sheets

(METH)ACRYLATE POLYMER, A RESIN COMPOSITION AND A SHAPED ARTICLE

This application is a divisional application of U.S. Ser. No. 13/255,726, filed on Oct. 18, 2011 (now abandoned), which is a U.S. national stage application of PCT/JP2010/053832 filed on Mar. 9, 2010.

TECHNICAL FIELD

The present invention relates to a (meth)acrylate polymer, a resin composition comprising the (meth)acrylate polymer, a shaped article obtained with shaping of the resin composition, a process for producing the (meth)acrylate polymer, and a process for producing a powdery (meth)acrylate polymer.

The resin composition of the present invention is specifically useful as sealing materials for semiconductors, and adhesives.

BACKGROUND ART

Resin-shaped articles are produced for various applications such as electric or electronic parts, auto parts and building materials.

In these resin-shaped articles, at least one kind of resin and at least one kind of additive are applied for obtaining of required performance depending on an object.

For example, in electric or electronic parts such as transistors and IC, plastic sealing using a epoxy resin composition is adopted mainly.

Plastic sealing with the epoxy resin composition is excellent in mass productivity and products can be obtained cheaply.

However, in plastic sealing, stress relaxation after the sealing happens as a big problem because coefficient of linear expansion of a resin is higher than the one of a semiconductor element.

In addition, epoxy resins are much applied to insulating layers of laminated sheets for electric insulation or printed wiring boards.

In recent years, printed wiring board-mounting technologies have been improved and using-conditions of printed wiring boards have been changed.

So, demand for getting reduction in elastic modulus is high.

In each of Japanese Patent Laid-Open No. 2000-7,890 and Japanese Patent Laid-Open No. 2004-315,572, there is proposed a method to blend a graft polymer obtained with graft polymerization of a monomer mixture onto a rubber particle as a method to get reduction in elastic modulus of an epoxy resin-shaped article.

In Japanese Patent Laid-Open No. Hei 5-65,391, there is proposed a method to blend a graft polymer obtained with graft polymerization of a monomer mixture containing a cross-linkable monomer onto a rubber particle as a method to improve storage stability of an epoxy resin composition.

SUMMARY OF INVENTION

Technical Problem

However, with methods of Japanese Patent Laid-Open No. 2000-7,890 and Japanese Patent Laid-Open No. 2004-315,572, there has a problem of insufficiency in storage stability of resin compositions obtained because cross-linkable monomers are not contained in monomer mixtures for graft polymerization.

Also, with a method of Japanese Patent Laid-Open No. Hei 5-65,391, there is a problem of lack in dispersibility of a graft polymer in a resin because a volume average primary particle size of a graft polymer is small, and a problem of lack in getting of reduction in elastic modulus because a peak height of tan δ of the graft polymer is low.

The object of the present invention is to provide a (meth)acrylate polymer which is excellent in dispersibility of primary particles in a resin, which gives excellent storage stability of a resin composition obtained, and which gives excellent reduction in elastic modulus and insulating properties of a shaped article obtained.

Solution to Problem

The present invention is a (meth)acrylate polymer having a volume average primary particle size of 0.520 to 3.00 μm, a peak temperature of tan δ in the range of −100 to 0° C., determined with dynamic viscoelasticity measurement, of −40° C. or below, a peak height of tan δ in the range of −100 to 0° C., determined with dynamic viscoelasticity measurement, of 0.300 or more, and an acetone-insoluble component of 99% by mass or more.

Also, the present invention is a resin composition comprising the (meth)acrylate polymer and a resin.

In addition, the present invention is a shaped article obtained with shaping of the resin composition.

Also, the present invention is a sealing material for semiconductors comprising the (meth)acrylate polymer and a resin.

In addition, the present invention is an adhesive comprising the (meth)acrylate polymer and a resin.

Also, the present invention is a process for producing the (meth)acrylate polymer comprising polymerization of monomer mixture (b) in the presence of rubbery (meth)acrylate polymer (A), wherein monomer mixture (b) comprises cross-linkable monomer (b1), the content of rubbery (meth)acrylate polymer (A) is 81 to 98% by mass and the content of monomer mixture (b) is 2 to 19% by mass (total of rubbery (meth)acrylate polymer (A) and monomer mixture (b) is 100% by mass), and the (meth)acrylate polymer has the volume average primary particle size of 0.520 to 3.00 μm and the peak temperature of tan δ in the range of −100 to 0° C., determined with dynamic viscoelasticity measurement, of −40° C. or below.

In addition, the present invention is a process for producing a powdery (meth)acrylate polymer comprising polymerization of monomer mixture (b) in the presence of rubbery (meth)acrylate polymer (A) and spray-drying of a latex of the (meth)acrylate polymer, wherein monomer mixture (b) comprises cross-linkable monomer (b1), a composition ratio of rubbery (meth)acrylate polymer (A) and monomer mixture (b) at the point of polymerization of monomer mixture (b) is 81 to 98% by mass of rubbery (meth)acrylate polymer (A) and 2 to 19% by mass of monomer mixture (b) (total of rubbery (meth)acrylate polymer (A) and monomer mixture (b) is 100% by mass), and the (meth)acrylate polymer has the volume average primary particle size of 0.520 to 3.00 μm and the peak temperature of tan δ in the range of −100 to 0° C., determined with dynamic viscoelasticity measurement, of −40° C. or below.

Advantageous Effects of Invention

With the use of the (meth)acrylate polymer of the present invention, excellent dispersibility of the primary particles in a resin can be obtained, excellent storage stability of the resin composition can be obtained, and excellent reduction in elastic modulus and insulating properties of a shaped article can be obtained.

In addition, the resin composition of the present invention is useful as sealing materials for semiconductors and adhesives.

DESCRIPTION OF EMBODIMENTS

Figure 1:
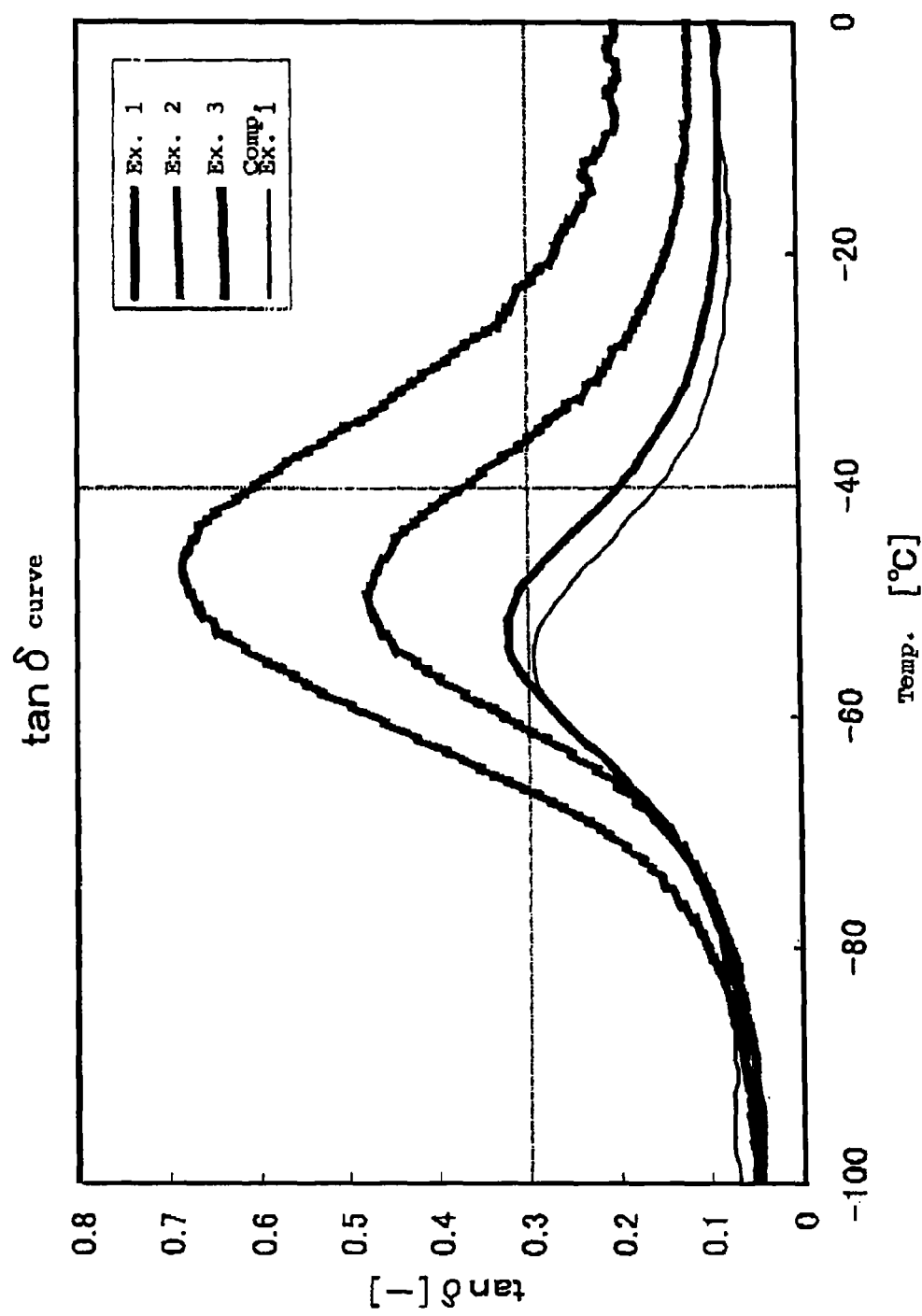
FIG. 1 shows tan δ curves in −100 to 0° C. determined with dynamic viscoelasticity measurement of (meth)acrylate polymers obtained with Examples 1 to 3 and Comparative example 1.
Figure 2:
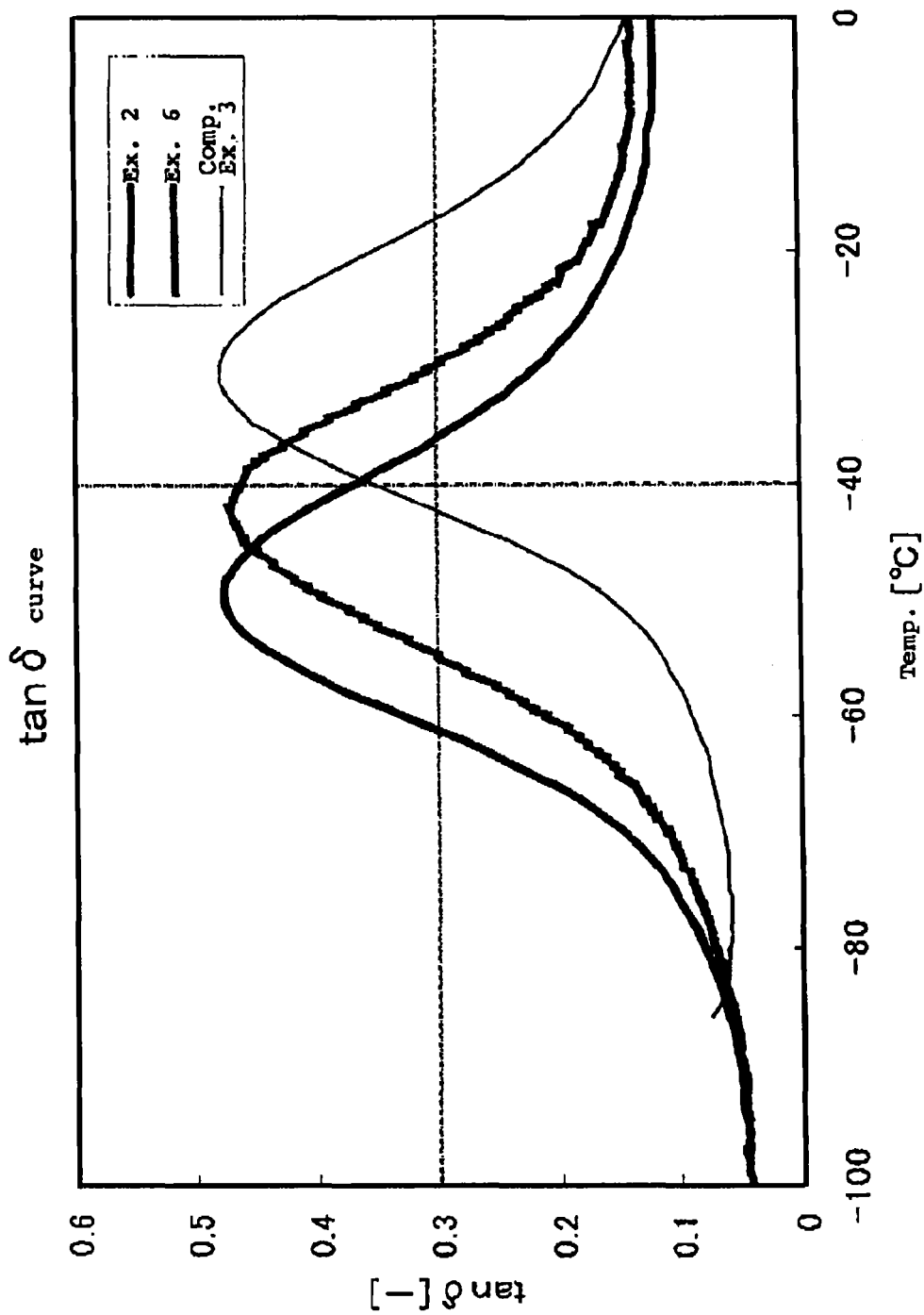
FIG. 2 shows tan δ curves in −100 to 0° C. determined with dynamic viscoelasticity measurement of (meth)acrylate polymers obtained with Examples 2 and 6, and Comparative example 3.

The (meth)acrylate polymer of the present invention has the peak temperature of tan δ in −100 to 0° C., determined with dynamic viscoelasticity measurement, of −40° C. or below.

It is noted that "(meth)acrylate" shows "acrylate" or "methacrylate" in the present specification.

The peak temperature of tan δ is −40° C. or below, preferably −45° C. or below, and more preferably −48° C. or below.

Also, the peak temperature of tan δ is preferably −90° C. or above, and more preferably −80° C. or above.

When the peak temperature of tan δ is −40° C. or below, excellent reduction in elastic modulus at a low temperature of the shaped article obtained can be achieved.

The peak temperature of tan δ can be set appropriately with adjustment of glass transition temperature of rubbery (meth)acrylate polymer (A) in the (meth)acrylate polymer.

For example, a glass transition temperature of rubbery (meth)acrylate polymer (A) may be designed to be −40° C. or below to make the peak temperature of tan δ −40° C. or below, and a glass transition temperature of rubbery (meth)acrylate polymer (A) may be designed to be −90° C. or below to make the peak temperature of tan δ −90° C. or below.

The glass transition temperature of rubbery (meth)acrylate polymer (A), to make the peak temperature of tan δ −40° C. or below, is −40° C. or below, preferably −45° C. or below, and more preferably −48° C. or below.

In general, a polymer can not show sufficient rubber elasticity at the temperature lower than the glass transition temperature of the polymer.

Therefore, it is preferable that the glass transition temperature of rubbery (meth)acrylate polymer (A) be lower, namely, as the peak temperature of tan δ of the (meth)acrylate polymer be lower, from the viewpoint that rubber elasticity at a lower temperature can be developed.

The (meth)acrylate polymer of the present invention has the peak height of tan δ in the range of −100 to 0° C., determined with dynamic viscoelasticity measurement, of 0.300 or more.

The peak height of tan δ is 0.300 or more, preferably 0.350 or more, more preferably 0.400 or more, and further more preferably 0.450 or more.

Also, the peak height of tan δ is preferably 1.00 or less, more preferably 0.900 or less, and further more preferably 0.800 or less.

When the peak height of tan δ is 0.300 or more, excellent reduction in elastic modulus of the shaped article can be achieved.

The peak height of tan δ can be set appropriately with adjustment of the content of rubbery (meth)acrylate polymer (A) in the (meth)acrylate polymer and the content of cross-linkable monomer (a1) in monomer mixture (a) to be used for obtaining of rubbery (meth)acrylate polymer (A).

For example, to make the peak height of tan δ 0.300 or more, the content of rubbery (meth)acrylate polymer (A) in the (meth)acrylate polymer may be designed to be in the range of 81% by mass or more in 100% by mass of the (meth)acrylate polymer and the content of cross-linkable monomer (a1) in monomer mixture (a) to be used for obtaining of rubbery (meth)acrylate polymer (A) may be designed to be in the range of 2.5% by mass or less in 100% by mass of monomer mixture (a).

The content of rubbery (meth)acrylate polymer (A) in the (meth)acrylate polymer, to make the peak height of tan δ 0.300 or more, is 81% by mass or more, preferably 83% by mass or more, and more preferably 86% by mass or more, in 100% by mass of the (meth)acrylate polymer.

The content of rubbery (meth)acrylate polymer (A) in the (meth)acrylate polymer can be confirmed with the use of an analyser such as a pulsed NMR.

The content of cross-linkable monomer (a1) in monomer mixture (a) to be used for obtaining of rubbery (meth)acrylate polymer (A), to make the peak height of tan δ 0.300 or more, is 2.5% by mass or less, preferably 2.3% by mass or less, and more preferably 2.0% by mass or less.

In general, sufficient rubber elasticity cannot be developed when the peak height of tan δ in a rubber domain is low.

Therefore, it is preferable that the peak height of tan δ of the (meth)acrylate polymer be higher, from the viewpoint that rubber elasticity can be developed.

In dynamic viscoelasticity measurement in the present invention, a test piece of 3 mm (thickness)×10 mm (width)× 50 mm (length) from the powdery (meth)acrylate polymer was obtained with the use of a heat pressing machine.

Dynamic viscoelasticity measurement in the present invention was carried out under conditions of a rate of increasing temperature of 2° C./m and frequency of 10 Hz, with a dual cantilever bending mode with the use of a dynamic mechanical analyser.

In addition, the peak temperature of tan δ and the peak height of tan δ were determined with a peak in the range of −100 to 0° C. of the tan δ curve obtained with the above measurement.

Rubbery (meth)acrylate polymer (A) having a glass transition temperature of lower than −40° C. can be obtained with polymerization of monomer mixture (a) comprising (meth)acrylate monomer (a2) which gives a homopolymer having a glass transition temperature of −40° C. or below and which is a main component.

A glass transition temperature of a homopolymer can be confirmed with the use of publicly known methods for measurement such as dynamic viscoelasticity analysis, differential scanning calorimetry, thermogravimetry-differential thermal analysis, and thermomechanical analysis.

Examples of (meth)acrylate monomer (a2) include 2-ethylhexyl acrylate, isooctyl acrylate, 2-methoxyethyl acrylate, and ethylcarbitol acrylate.

(Meth)acrylate monomer (a2) may be used alone or in combination.

In the above (meth)acrylate monomer (a2), 2-ethylhexyl acrylate, isooctyl acrylate are preferable from the viewpoint of excellent polymerization stability, and 2-ethylhexyl acrylate is more preferable from the viewpoint of obtaining of reduction in elastic modulus at a low temperature of the shaped article obtained.

The content of (meth)acrylate monomer (a2) is preferably 69.999 to 99.999% by mass, more preferably 79.99 to 99.99% by mass, and further more preferably 89.9 to 99.9% by mass, in 100% by mass of monomer mixture (a).

When the content of (meth)acrylate monomer (a2) is 69.999% by mass or more, the peak temperature of tan δ of the (meth)acrylate polymer shows −40° C. or below, and as a result, the shaped article obtained has excellent reduction in elastic modulus at low temperature.

In addition, when the content of the (meth)acrylate monomer (a2) is 99.999% by mass or less, the acetone-insoluble component of the (meth)acrylate polymer shows 99% by mass or more, and as a result, the resin composition obtained has excellent storage stability.

Monomer mixture (a) can contain other monomer (a3) except (meth)acrylate monomer (a2) if necessary in the extent that the peak temperature of tan δ of the (meth)acrylate polymer is −40° C. or below.

Examples of other monomer (a3) include (meth)acrylates, which give homopolymers having glass transition temperatures of higher than 40° C., such as methyl(meth)acrylate, ethyl(meth)acrylate, n-propyl(meth)acrylate, n-butyl(meth)acrylate, and i-butyl(meth)acrylate; aromatic vinyl monomers such as styrene, α-methyl styrene, and alkyl-substituted styrenes; vinyl cyanides such as acrylonitrile and methacrylonitrile; vinyl monomers having glycidyl group such as glycidyl(meth)acrylate and allyl glycidyl ether; vinyl monomers having hydroxyl group such as hydroxy(meth)acrylate; (meth)acryl group-modified silicones; and halogen-containing vinyl monomers.

Other monomer (a3) may be used alone or in combination.

The content of other monomer (a3) is preferably 30% by mass or less, more preferably 20% by mass or less, and further more preferably 10% by mass or less, in 100% by mass of monomer mixture (a).

When the content of other monomer (a3) is 30% by mass or less, the peak temperature of tan δ of the (meth)acrylate polymer shows −40° C. or below, and as a result, the shaped article obtained has excellent reduction in elastic modulus at low temperature.

Monomer mixture (a) may contain cross-linkable monomer (a1) if necessary.

Examples of cross-linkable monomer (a1) include ethyleneglycol di(meth)acrylate, propylene glycol di(meth)acrylate, 1,3-butylene glycol di(meth)acrylate, 1,4-butylene glycol di(meth)acrylate, allyl(meth)acrylate, triallyl cyanurate, triallyl isocyanurate, divinylbenzene, and polyfunctional (meth)acryl group-modified silicones.

Cross-linkable monomer (a1) may be used alone or in combination.

It is noted that cross-linkable monomer (a1) such as ally(meth)acrylate, triallyl cyanurate, and triallyl isocyanurate has a function as well as a graftlinking agent.

The content of cross-linkable monomer (a1) is preferably 0.0001 to 2.5% by mass, more preferably 0.01 to 2.3% by mass, and further more preferably 0.1 to 2.0% by mass, in 100% by mass of monomer mixture (a).

When the content of cross-linkable monomer (a1) is 0.001% by mass or more, the acetone-insoluble component of the (meth)acrylate polymer shows 99% by mass or more, and as a result, the resin composition obtained has excellent storage stability.

When the content of cross-linkable monomer (a1) is 2.5% by mass or less, the peak height of tan δ of the (meth)acrylate polymer shows 0.300 or more, and as a result, the shaped article obtained has excellent reduction in elastic modulus at low temperature.

A polymerization method of monomer mixture (a) is not limited especially.

However, it is preferable using a polymerization easy to obtain spherical particles.

Examples of the above polymerization include emulsion polymerization, soap-free polymerization, soap-free emulsified polymerization, dispersion polymerization, swelling polymerization, mini-emulsion polymerization, and micro suspension polymerization.

For a polymerization initiator to be used for polymerization of monomer mixture (a), well-known polymerization initiators can be used.

However, it is preferable to use polymerization initiators without containing metal ions from the viewpoint that no remaining of metal ions can be achieved in the case of obtaining of the powdery (meth)acrylate polymer with the use of spray-drying.

Examples of the polymerization initiator without containing metal ions include azo compounds such as 2,2'-azobisisobutyronitrile, 4,4'-azobis-(4-cyanovaleric acid), and 2,2'-azobis-[N-(2-carboxyethyl)-2-methyl propione amidine]; persulfuric acid compounds such as ammonium persulfate; organic peroxides such as diisopropyl benzene hydroperoxide, p-menthane hydroperoxide, cumene hydroperoxide, and t-butyl hydroperoxide; and redox initiators using the persulfuric acid compounds or the organic peroxides.

These polymerization initiators may be used alone or in combination.

In these polymerization initiators without containing metal ions, it is preferable using of ammonium persulfate, 2,2'-azobisisobutyronitrile, 4,4'-azobis-(4-cyanovaleric acid), or 2,2'-azobis-[N-(2-carboxyethyl)-2-methyl propione amidine] from the viewpoint of excellent polymerization stability of monomer mixture (a).

For an emulsifier to be used for polymerization of monomer mixture (a), well-known emulsifiers can be used.

Examples of the emulsifier include alkali metal salts or ammonium salts of higher fatty acids such as disproportionated rosin acids, oleic acid, and stearic acid; alkali metal salts or ammonium salts of sulfonic acids such as dodecyl benzene sulfonic acid; and nonionic emulsifiers.

In these emulsifiers, it is preferable using ammonium salt-type anionic emulsifiers or nonionic emulsifiers from the viewpoint that no remaining of metal ions can be achieved in the case of obtaining of the powdery (meth)acrylate polymer with the use of spray-drying.

For ammonium salt-type anionic emulsifiers, it is preferable using lauryl ammonium sulfate or di-(2-ethylhexyl) sulfosuccinic acid ammonium from the viewpoint of excellent stability of emulsion polymerization.

For nonionic emulsifiers, it is preferable using polyoxyethylene (85) monotetradecyl ether or polyoxyethylene distyrene phenyl ether from the viewpoint of excellent stability of emulsion polymerization.

In the case of polymerization of monomer mixture (a), a chain transfer agent can be used if necessary.

Rubbery (meth)acrylate polymer (A) may have a monolayer structure or a multilayer structure with 2 steps.

In addition, at least two kinds of rubbery (meth)acrylate polymer (A) may be composited.

The (meth)acrylate polymer of the present invention has the acetone-insoluble component of 99% by mass or more.

The acetone-insoluble component is 99% by mass or more, preferably 99.5% by mass or more, and more preferably 99.8% by mass or more.

When the acetone-insoluble component is 99% by mass or more, the resin composition obtained has excellent storage stability.

The (meth)acrylate polymer of the present invention has the acetone-insoluble component of 99% by mass or more, so that the (meth)acrylate polymer of the present invention does not include a (meth)acrylate type thermoplastic elastomer having the acetone-insoluble component of less than 99% by mass.

The acetone-insoluble component can be set appropriately with adjusting of the content of cross-linkable monomer (a1) in monomer mixture (a) and the content of cross-linkable monomer (b1) in monomer mixture (b).

The acetone-insoluble component in the present invention was measured as follows.

The powdery (meth)acrylate polymer is weighed with approximately 1 g and added in an eggplant-shaped flask, and then 50 mL of acetone is added.

Subsequently, a condenser is attached to the eggplant-shaped flask, and acetone is refluxed at 68° C. for 6 hours.

After cooling of the inside of the flask, the inside of the flask is moved in a cell for centrifugation, and centrifugation is carried out with 14,000 rpm, at 4° C. for 30 minutes.

After centrifugation, a supernatant liquid is removed from the cell.

After 50 mL of acetone is added in the cell, the cell is dipped in a supersonic water bath (40 mm×240 mm×150 mm) in which 1,000 g of deionized water was served, and then sonication is carried out at 100 W for more than 30 minutes.

Two times of operations of centrifugation and removal of the supernatant liquid are repeated.

After preliminary drying of a solid component obtained at 68° C. for 3 hours, the solid component is dried with 1,333 Pa, at 50° C. for 12 hours, and then the solid is weighed as the acetone-insoluble component.

The acetone-insoluble component is calculated with Formula 1 based on mass of the powdery (meth)acrylate polymer used and mass of the acetone-insoluble component.

Acetone-insoluble component [%]={[mass of acetone-insoluble component]/[mass of powdery (meth)acrylate polymer used]}×100     (Formula 1)

The content of cross-linkable monomer (a1), in monomer mixture (a), to make the acetone-insoluble component 99% by mass or more is 0.001% by mass or more, preferably 0.01% by mass or more, and more preferably 0.1% by mass or more, in 100% by mass of monomer mixture (a).

The content of cross-linkable monomer (b1), in monomer mixture (b), to make the acetone-insoluble component 99% by mass or more is 0.1% by mass or more, preferably 0.5% by mass or more, and more preferably 2% by mass or more, in 100% by mass of monomer mixture (b).

Examples of cross-linkable monomer (b1) contained in monomer mixture (b) include ethyleneglycol di(methi)acrylate, propylene glycol di(meth)acrylate, 1,3-butylene glycol di(meth)acrylate, 1,4-butylene glycol di(meth)acrylate, divinylbenzene, polyfunctional (meth)acryl group-modified silicones, and allyl(meth)acrylate.

Cross-linkable monomer (b1) may be used alone or in combination.

In cross-linkable monomer (b1), it is preferable using ally(meth)acrylate, ethyleneglycol di(methi)acrylate or divinylbenzene, and ally(meth)acrylate is more preferable, from the viewpoint of polymerization stability of monomer mixture (b).

The content of cross-linkable monomer (b1) is preferably 0.1 to 30% by mass, more preferably 0.5 to 20% by mass, and further more preferably 2 to 8% by mass, in 100% by mass of monomer mixture (b).

When the content of cross-linkable monomer (b1) is 0.1% by mass or more, the acetone-insoluble component shows 99% by mass or more, and as a result, the resin composition obtained has excellent storage stability.

When the content of cross-linkable monomer (b1) is 30% by mass or less, the shaped article obtained has excellent reduction in elastic modulus at low temperature.

Monomer mixture (b) contains vinyl monomer (b2) except cross-linkable monomer (b1).

Examples of vinyl monomer (b2) include alkyl(meth)acrylates such as methyl(meth)acrylate, ethyl(meth)acrylate, n-propyl(meth)acrylate, n-butyl(meth)acrylate, and i-butyl (meth)acrylate; aromatic vinyl monomers such as styrene, α-methyl styrene, and alkyl-substituted styrenes; vinyl cyanides such as acrylonitrile and methacrylonitrile; vinyl monomers having glycidyl group such as glycidyl(meth)acrylate and allyl glycidyl ether; vinyl monomers having hydroxy group such as hydroxy(meth)acrylate; (meth)acryl group-modified silicones; and halogen-containing vinyl monomers.

These monomers may be used alone or in combination.

In vinyl monomer (b2), it is preferable using alkyl(meth)acrylates, aromatic vinyl monomers, vinyl cyanides, or vinyl monomers having glycidyl group, more preferable using an alkyl(meth)acrylate such as methyl(meth)acrylate, ethyl (meth)acrylate, n-propyl(meth)acrylate, n-butyl(meth)acrylate, or i-butyl(meth)acrylate; or a vinyl monomer having glycidyl group such as glycidyl(meth)acrylate or allyl glycidyl ether, and further more preferable using methyl(meth)acrylate, ethyl(meth)acrylate, n-butyl(meth)acrylate, or glycidyl(meth)acrylate from the viewpoint of excellent polymerization stability, excellent affinity with an epoxy resin, and excellent heat resistance of the shaped article obtained.

The content of vinyl monomer (b2) is preferably 70 to 99.9% by mass, more preferably 80 to 99.5% by mass, and further more preferably 92 to 98% by mass, in 100% by mass of monomer mixture (b).

When the content of vinyl monomer (b2) is 70% by mass or more, the shaped article obtained has excellent reduction in elastic modulus at low temperature.

When the content of vinyl monomer (b2) is 99.9% by mass or less, the acetone-insoluble component shows 99% by mass or more, and as a result, the resin composition obtained has excellent storage stability.

The polymer of monomer mixture (b) in the present invention may have a monolayer structure or a multilayer structure with 2 steps.

A polymerization method of monomer mixture (b) is not limited especially.

However, it is preferable using a polymerization easy to obtain spherical particles.

Examples of the above polymerization include emulsion polymerization, soap-free polymerization, dispersion polymerization, swelling polymerization, mini-emulsion polymerization, and micro suspension polymerization.

Spherical polymer particles are preferable from the viewpoint that rise of viscosity of the resin composition obtained is restrained and the resin composition has excellent flowability in the case of blending of a powdery polymer.

For a polymerization initiator to be used for polymerization of monomer mixture (b), there can be used the same compounds as polymerization initiators to be used for polymerization of monomer mixture (a).

In the case of polymerization of monomer mixture (b), an emulsifier may be used if necessary.

For the emulsifier to be used for polymerization of monomer mixture (b), there can be used the same compounds as emulsifiers to be used for polymerization of monomer mixture (a).

In the case of polymerization of monomer mixture (b), a chain transfer agent can be used if necessary.

The contents of rubbery (meth)acrylate polymer (A) and monomer mixture (b) in the case of polymerization of the monomer mixture (b) are 81 to 98% by mass of rubbery (meth)acrylate polymer (A) and 2 to 19% by mass of monomer mixture (b), preferably 83 to 96% by mass of rubbery (meth)acrylate polymer (A) and 4 to 17% by mass of monomer mixture (b), and further more preferably 86 to 93% by mass of rubbery (meth)acrylate polymer (A) and 7 to 14% by mass of monomer mixture (b), in 100% by mass of rubbery (meth)acrylate polymer (A) and monomer mixture (b) in total.

When the content of rubbery (meth)acrylate polymer (A) is 81% by mass or more, the peak height of tan δ of the (meth)acrylate polymer shows 0.300 or more, and as a result, the shaped article obtained has excellent reduction in elastic modulus at low temperature.

In addition, when the content of rubbery (meth)acrylate polymer (A) is 98% by mass or less, the resin composition obtained has excellent storage stability.

When the content of monomer mixture (b) is 2% by mass or more, the resin composition obtained has excellent storage stability.

When the content of monomer mixture (b) is 19% by mass or less, the peak height of tan δ of the (meth)acrylate polymer shows 0.300 or more, and as a result, the shaped article obtained has excellent reduction in elastic modulus at low temperature.

The (meth)acrylate polymer of the present invention has the volume average primary particle size of 0.520 to 3.00 µm.

The volume average primary particle size of the (meth)acrylate polymer is 0.520 to 3.00 µm, preferably 0.530 to 2.00 µm, and more preferably 0.550 to 1.50 µm.

When the volume average primary particle size of the (meth)acrylate polymer is 0.520 µm or more, the primary particles of the (meth)acrylate polymer in the resin is excellent in dispersibility.

In addition, when the volume average primary particle size of the (meth)acrylate polymer is 3.00 µm or less, the shaped article obtained does not lost original characteristics of the resin.

For a method for adjusting the volume average primary particle size, well-known methods can be used.

Examples of methods for adjusting the volume average primary particle size include a method to adjust amounts of an emulsifier and a method to adjust the ratio of a monomer to a dispersion medium.

In these methods, it is preferable using soap-free emulsion polymerization, which is a method of performing of emulsion polymerization after obtaining of seed particles with soap-free polymerization, from the viewpoint of easiness of controlling of the volume average primary particle size.

The volume average primary particle size of the (meth)acrylate polymer of the present invention was determined by measurement of a laser diffraction scattering method with the use of a laser diffraction/particle size distribution analyser.

The latex of the (meth)acrylate polymer obtained may contain antioxidants and additives if necessary.

Examples of the antioxidant include phenolic antioxidants such as IRGANOX 1076 DWJ, IRGANOX 245 DWJ and IRGASTAB MBS 11 (products made in Ciba Japan Co., Ltd.) and composite type antioxidants such as ADEKA-STAB LX-803 (made in ADEKA Corporation).

For a method for producing a powdery polymer from a latex of the (meth)acrylate polymer of the present invention, well-known methods for a powdery polymer can be used.

Examples of the method for producing the powdery polymer include a spray-drying method, freeze-drying method, and coagulation method.

In these methods, a spray-drying method is preferable from the viewpoint of excellent dispersibility of the (meth)acrylate polymer in the resin.

The spray-drying method is a method of drying of microdroplets, which is obtained with spraying of a latex, with exposing of a hot wind.

Examples of a type to generate microdroplets include a rotation disk type, pressure nozzle type, two-fluid pressure nozzle type, and two-fluid nozzle type. For a capacity of the dryer, there can be used any scale from a small scale used in a laboratory to an extensive scale used industrially.

A location of an inlet-portion which is a feed section of heated gas for drying, and a location of an outlet portion which is an exhaust port of heated gas for drying and the powder may be the same as portions of spray dryers which are usually used.

The temperature (inlet temperature) of the hot wind to be introduced in a dryer, namely the maximum temperature of the hot wind which can contact with a graft copolymer is preferably 100 to 200° C., and more preferably 120 to 180° C., from the viewpoint of excellent dispersibility of primary particles of the (meth)acrylate polymer in the resin.

The latex of the (meth)acrylate polymer used for spray-drying may be one kind or a mixture of plural latices.

In addition, spray-drying can be carried out for the latex, in which additives such as silica was added, for improving of powder characteristics such as blocking in spray-drying and bulk specific gravity.

The volume average particle size of the powdery (meth)acrylate polymer obtained with spray-drying is preferably 5 to 300 µm, more preferably 10 to 220 µm, and further more preferably 20 to 200 µm.

When the volume average particle size of the powdery (meth)acrylate polymer is 5 µm or more, powder rarely flies, so that the volume average particle size of the powdery (meth)acrylate polymer is excellent in powder handling characteristics.

In addition, when the volume average particle size of the powder of the (meth)acrylate polymer is 300 µm or less, the primary particles of the (meth)acrylate polymer in the resin is excellent in dispersibility.

A moisture content in the powdery (meth)acrylate polymer is preferably 1.5% by mass or less, and more preferably 1.0% by mass or less, in 100% by mass of the powdery (meth)acrylate polymer.

When the moisture content in the powdery (meth)acrylate polymer is 1.5% by mass or less, generation of crack is restrained in case of shaping of the resin composition obtained.

The content of each of metal ions in the powdery (meth)acrylate polymer is preferably less than 10 ppm.

When the content of each of metal ions in the powdery (meth)acrylate polymer is less than 10 ppm, the shaped article obtained has excellent insulating properties.

The content of sulfate ion in the powdery (meth)acrylate polymer is preferably less than 500 ppm, and more preferably less than 300 ppm.

When sulfate ion in the (meth)acrylate polymer is less than 500 ppm, the shaped article obtained has excellent insulating properties.

The content of ionic impurities such as metal ions or sulfate ion in the powdery (meth)acrylate polymer is based on the content of ions extracted with hot water extraction.

The (meth)acrylate polymer of the present invention is useful as an additive for the resin with stress relaxation properties, and is specifically useful as an additive for an epoxy resin with stress relaxation properties, from the viewpoint of getting reduction in elastic modulus of the shaped article obtained with blending.

The resin composition of the present invention comprises the (meth)acrylate polymer of the present invention and the resin.

For the resin, a variety of curable resins or thermoplastic resins are applied.

However, curable resins are preferable and epoxy resins are more preferable, from the viewpoint of an effect as a resin type additive of the (meth)acrylate polymer.

Examples of the curable resin include an epoxy resin, a phenol resin, an unsaturated polyester resin, a melamine resin, and an urea resin.

These resins may be used alone or in combination.

For the epoxy resin, well-known epoxy resins can be used, and a molecular structure or molecular weight of the epoxy resin is not restricted specifically.

Examples of the epoxy resin include bisphenol A type epoxy resins, bisphenol F type epoxy resins, bisphenol AD type epoxy resins, bisphenol E type epoxy resins, naphthalen type epoxy resins, biphenyl type epoxy resins, dicyclopentadiene type epoxy resins, phenol novolac type epoxy resins, cycloaliphatic epoxy resins, and glycidyl amine type epoxy resins.

In addition, examples of the epoxy resin include prepolymers of the above epoxy resins; copolymers of the epoxy resin and other polymers such as polyether modified epoxy resins and silicone modified epoxy resins; and resins of which a part of epoxy resins are substituted for reactive diluents.

These epoxy resins may be used alone or in combination.

Examples of the reactive diluent include mono glycidyl compounds such as resorcin glycidyl ether, t-butyl phenyl glycidyl ether, 2-ethylhexy glycidyl ether, allyl glycidyl ether, phenyl glycidyl ether, 3-glycidoxy propyl trimethoxy silane, 3-glycidoxy propyl methyl dimethoxy silane, 1-(3-glycidoxy propyl)-1,1,3,3,3-pentamethylsiloxane, and N-glycidyl-N, N-bis-[3-(trimethoxysilyl)propyl]amine; monocycloaliphatic epoxy compounds such as 2-(3,4-epoxy cyclohexyl)ethyl trimethoxysilane.

These reactive diluents may be used alone or in combination.

Examples of a curing agent of the epoxy resin include acid anhydrides, amine compounds, and phenolic compounds.

In these curing agents, acid anhydrides are preferable from the viewpoint of excellent heat resistance or chemical resistance of a cured resin.

Curing ability of the epoxy resin or properties of the cured epoxy resin can be adjusted with the use of the curing agent.

Examples of the acid anhydride include phthalic anhydride, methyl tetrahydrophthalic anhydride, methyl hexahydrophthalic anhydride, hexahydrophthalic anhydride, tetrahydrophthalic anhydride, trialkyl tetrahydrophthalic anhydride, methyl himick acid anhydride, methylcyclohexene dicarboxylic acid anhydride, trimellitic anhydride, pyromellitic acid anhydride, benzophenone tetracarboxylic acid anhydride, ethylene glycol bis(anhydrotrimellitates), glycerol tris(anhydrotrimellitates), dodecenyl succinic anhydride, polyazelaic polyanhydride, and poly(ethyl octadecanedioic acid)anhydride.

These acid anhydrides may be used alone or in combination.

In these acid anhydrides, methyl hexahydrophthalic anhydride and hexahydrophthalic anhydride are preferable in an application that weather resistance, light resistance, or heat resistance is required.

Examples of the amine compound include 2,5(2,6)-bis (aminomethyl)bicycle[2,2,1]heptane, isophorone diamine, ethylenediamine, diethylenetriamine, triethylenetetramine, tetraethylenepentamine, diethylamino propylamine, bis-(4-amino-3-methyl dicyclohexyl)methane, diamino dicyclohexylmethane, bis(aminomethyl)cyclohexane, meta phenylenediamine, diaminodiphenyl methane, diaminodiphenyl sulphone, diaminodiethyl diphenylmethane, and diethyltoluene diamine.

These amine compounds may be used alone or in combination.

In these amine compounds, 2,5(2,6)-bis(aminomethyl) bicyclo[2,2,1]heptane and isophorone diamine are preferable in an application that weather resistance, light resistance, or heat resistance is required.

Examples of the phenolic compound include phenolic novolac resins, creosol novolac resins, bisphenol A, bisphenol F, bisphenol AD, and diallyl derivatives of the bisphenols.

These phenolic compounds may be used alone or in combination.

The amount of the curing agent of the epoxy resin is not restricted specifically, but it is necessary to consider a stoichiometric quantity of epoxy group.

When the epoxy resin is cured, an accelerator or a latent curing agent may be used if necessary.

For the accelerator, well-known accelerators can be used. Examples of the accelerator include imidazole compounds such as 2-methyl imidazole and 2-ethyl-4-methyl imidazoles; adducts of imidazole compounds and the epoxy resin; organophosphorous compounds such as triphenylphosphine; borates such as tetraphenyl phosphine tetraphenylborate; and Diazabicyclo undecene.

These accelerators may be used alone or in combination.

The latent curing agent is a solid at room temperature, and it liquefies in heat curing of the epoxy resin to act as the curing agent.

Examples of the latent curing agent include dicyandiamide, carbohydrazide, oxalic dihydrazide, malonic acid dihydrazide, succinic acid dihydrazide, imino diacetic acid dihydrazide, adipic acid dihydrazide, pimelic acid dihydrazide, suberic acid dihydrazide, azelaic acid dihydrazide, sebacic acid dihydrazide, dodecane dihydrazide, hexadecane dihydrazide, maleic acid dihydrazide, fumaric acid dihydrazide, diglycolic acid dihydrazide, tartaric acid dihydrazide, malic acid dihydrazide, isophthalic acid dihydrazide, terephthalic acid dihydrazide, 2,6-naphthoic acid dihydrazide, 4,4'-bis benzene dihydrazide, 1,4-naphthoic acid dihydrazide, AJICURE VDH and AJICURE UDH (both trade names, made in Ajinomoto Co., Inc.), and organic acid hydrazides such as citric acid trihydrazide.

These can be used alone or in combination.

The content of the (meth)acrylate polymer in the resin composition of the present invention is preferably 0.1 to 50 parts by mass and more preferably 0.5 to 30 parts by mass, in 100% by mass of the resin.

When the content of the (meth)acrylate polymer is 0.1 parts by mass or more, an effect as a resin type additive of the (meth)acrylate polymer is developed sufficiently.

In addition, when the content of the (meth)acrylate polymer is 50 parts by mass or less, there is shown excellent dispersibility of the powdery (meth)acrylate polymer in the resin.

The resin composition of the present invention may contain additives if necessary.

Examples of the additive include releasing agents such as silicone oil, natural wax, and synthetic wax; powder such as crystalline silica, fused silica, calcium silicate, and alumina; fibers such as glass fiber and carbon fiber; flame retardants such as antimony trioxide; halogen-trapping agents such as hydrotalcite and rare earth oxides; colorants such as carbon black and blood red; and silane coupling agents.

For a method for preparing the resin composition of the present invention, well-known methods can be used.

An example of methods for preparing the resin composition of the present invention include pulverization or tablet-making after cooling a mixture which was obtained with mixing of the resin composition under a solution state, or under melted state with the use of a mixing roll or kneader.

For preparing the resin composition of the present invention, there can be adopted the following method.

At first, water as a dispersing medium of a latex of the (meth)acrylate polymer is substituted with a solvent. Then, the solvent is substituted with a fluidal epoxy resin.

As a result, the (meth)acrylate polymer is blended with the epoxy resin.

However, it is preferable to obtain a composition of the (meth)acrylate polymer and the epoxy resin by blending the epoxy resin with the powdery (meth)acrylate polymer after powdering a latex of the (meth)acrylate polymer, from the viewpoint that the process is simple, and the (meth)acrylate polymer of the present invention has sufficiently excellent dispersibility as primary particles in the resin.

The shaped article of the present invention is obtained with shaping of the resin composition of the present invention.

For a molding process, well-known methods can be used.

Examples of the molding process include a transfer molding, sheet molding-compound molding, and bulk molding-compound molding.

The resin composition and shaped article of the present invention can be used for various applications such as electronic materials, and is specifically suitable for applications, such as sealing materials for semiconductors and adhesives, in which getting reduction in elastic modulus is required.

EXAMPLES

The present invention is described by embodiments as follows, but the present invention is not limited to the embodiments.

It is noted that "part" and "%" represent "part by mass" and "% by mass" respectively in embodiments.

(1) Volume Average Primary Particle Size

A latex of a (meth)acrylate polymer obtained was diluted in deionized water, and a median diameter with the volume average was measured with the use of a laser diffraction scattering type particle size distribution measuring apparatus ("LA-910" made in Horiba, Ltd.).

Concentration of a latex sample was adjusted appropriately so that it was set in the suitable range with the use of a scattering light strength monitor attached with a device.

(2) Volume Average Secondary Particle Size

A powdery (meth)acrylate polymer obtained was diluted in deionized water, and a median diameter with the volume average was measured with the use of a laser diffraction scattering type particle size distribution measuring apparatus ("LA-910" made in Horiba, Ltd.).

Concentration of a latex sample was adjusted appropriately so that it was set in the suitable range with the use of a scattering light strength monitor attached with a device.

(3) Peak Temperature of Tan δ and Peak Height of Tan δ

A test piece of 3 mm (thickness)×10 mm (width)×50 mm (length) from a powdery (meth)acrylate polymer obtained was prepared with the use of a heat pressing machine.

Tan δ curve of the above test piece is obtained with the use of a dynamic mechanical spectrometer ("EXSTAR DMS6100" made in Seiko Instruments Inc.) under conditions of rate of temperature increase of 2° C./m and frequency of 10 Hz, with both side-holding bending mode, and the peak-top temperature and the peak-top height were determined with a peak in the range of −100 to 0° C. of the tan δ curve.

(4) Content of Ions (Metal Ions)

In a glass pressure vessel, 20 g of a powdery (meth) acrylate polymer and 200 g of deionized water was added.

After closing of a cap of the vessel, the vessel was shaken and the powdery (meth)acrylate polymer was dispersed uniformly in water, then, the powdery (meth)acrylate polymer dispersion was obtained.

The powdery (meth)acrylate polymer dispersion was set in a gear oven for 20 hours at 95° C.

After the vessel was taken out from the oven and was cooled, the dispersion in the vessel was filtered with a membrane filter with Mixes Cellulose Ester Membranes of 0.2 μm, and a filtrate was added into a sampling bottle with 100 mL to be used for the sample for measurement.

Quantitative analyses of each of sodium ion ($Na^+$), potassium ion ($K^+$) and calcium ion ($Ca^{2+}$) was carried out with the following condition, and contents of metal ions in the powdery (meth)acrylate polymer were calculated with the use of Formula 2 based on the contents of metal ions in an extract-liquid extracted with hot water extraction.

Device: ICP emission spectrophotometer ("IRIS Intrepid II XSP", made in Thermo Fisher Scientific K. K.)

Calibration: an absolute calibration method with 4 points of 0 ppm, 0.1 ppm, 1 ppm, and 10 ppm Measurement wavelength: 589.5 nm ($Na^+$), 766.4 nm ($K^+$), and 184.0 nm and 317.9 nm ($Ca^{2+}$)

Content [ppm] of a metal ion in a powdery (meth) acrylate polymer=[content [ppm] of a metal ion in an extract-liquid]×[quantity [g] of deionized water used for extraction]/[mass [g] of a powdery (meth)acrylate polymer used]  (Formula 2)

(5) Content of an Ion (Sulfate Ion)

In a glass pressure vessel, 20 g of a powdery (meth) acrylate polymer and 200 g of deionized water was added with the use of a measuring cylinder.

After closing of a cap of the vessel, the vessel was shaken and the powdery (meth)acrylate polymer was dispersed uniformly in water, then, the powdery (meth)acrylate polymer dispersion was obtained.

The powdery (meth)acrylate polymer dispersion was set in a gear oven for 20 hours at 95° C.

After the vessel was taken out from the oven and was cooled, the dispersion in the vessel was filtered with a membrane filter with Mixes Cellulose Ester Membranes of 0.2 μm, and a filtrate was added into a sampling bottle with 100 mL to be used for the sample for measurement.

Quantitative analyses of sulfate ion ($SO_4^{2-}$) was carried out with the following condition, and the content of sulfate ion in the powdery (meth)acrylate polymer was calculated with the use of Formula 3 based on the content of sulfate ion in an extract-liquid extracted by hot water extraction.

Device: ion chromatograph: "IC-20 model" made in Dionex Corporation
Isolation column: IonPac AS12A
Calibration curve: an absolute calibration method with a point of 4 ppm Content [ppm] of sulfate ion in a powdery (meth) acrylate polymer=[content [ppm] of sulfate ion in an extract-liquid]×[quantity [g] of deionized water used for extraction]/[mass [g] of a powdery (meth)acrylate polymer used]  (Formula 3)

(6) Acetone-Insoluble Component

A powdery (meth)acrylate polymer obtained was weighed with approximately 1 g and added in an eggplant-shaped flask, and then 50 mL of acetone was added.

Subsequently, a condenser was attached to the eggplant-shaped flask, and acetone was refluxed at 68° C. for 6 hours.

After cooling of the inside of the flask, the inside of the flask was moved in a cell for centrifugation, and centrifugation was carried out with 14,000 rpm, at 4° C. for 30 minutes.

After centrifugation, a supernatant liquid was removed from the cell.

After 50 mL of acetone was added in the cell, the cell was dipped in a supersonic water bath (40 mm×240 mm×150 mm) in which 1,000 g of deionized water has been served, then sonication was carried out at 100 W for 30 minutes with the use of a sonication device ("W-211" made in Honda Electronics Co., Ltd.).

Two times of operations of centrifugation and removal of the supernatant liquid were repeated.

After preliminary drying of a solid component obtained at 68° C. for 3 hours, the solid component was dried with 1,333 Pa, at 50° C. for 12 hours, and then the solid component was weighed as the acetone-insoluble component.

The acetone-insoluble component was calculated with Formula 4 based on mass of the powdery (meth)acrylate polymer used and mass of the acetone-insoluble component.

Acetone-insoluble component [%]={[mass of acetone-insoluble component]/[mass of powdery (meth)acrylate polymer used]}×100  (Formula 4)

(7) Dispersibility

Dispersion level of the vinyl polymer powder in the epoxy resin composition was measured with the use of fineness gages according to JIS K-5600, and dispersibility was evaluated with the use of the following index.

A: 4.5 μm or less
B: more than 4.5 μm, and 10.0 μm or less
C: more than 10.0 μm (8) Storage Stability (40° C.)

After a resin composition obtained was adjusted to 25° C., viscosity was measured with rotation numbers of 100 rpm with the use of a BH type viscometer ("DV-II+Pro, Spindle No. 6", made in Brookfield Engineering Laboratories, Inc.).

The above viscosity was defined as the viscosity before keeping for 48 hours.

Then, the resin composition obtained was adjusted to 25° C. after keeping for 48 hours in a thermostatic chamber of 40° C. and viscosity was measured with the use of a BH type viscometer like the measurement of the viscosity before keeping for 48 hours.

The above viscosity was defined as the viscosity after keeping for 48 hours.

An increasing rate of viscosity was calculated with Formula 5, and storage stability was evaluated with the following index.

Increasing rate of viscosity [%]=([viscosity after keeping for 48 hours]/[viscosity before keeping for 48 hours]−1)×100  (Formula 5)

A: 10% or less
B: more than 10%, and 50% or less
C: more than 50%

(9) Storage Stability (80° C.)

After a resin composition obtained was adjusted to 25° C., viscosity was measured with rotation numbers of 100 rpm with the use of a BH type viscometer ("DV-II+Pro, Spindle No. 6", made in Brookfield Engineering Laboratories, Inc.).

The above viscosity was defined as the viscosity before keeping for 48 hours.

Then, the resin composition obtained was adjusted to 25° C. after keeping for 48 hours in a thermostatic chamber of 80° C. and viscosity was measured with the use of a BH type viscometer like the measurement of the viscosity before keeping for 48 hours.

The above viscosity was defined as the viscosity after keeping for 48 hours.

An increasing rate of viscosity was calculated with Formula 6, and storage stability was evaluated with the following index.

Increasing rate of viscosity [%]=([viscosity after keeping for 48 hours]/[viscosity before keeping for 48 hours]−1)×100  (Formula 6)

A: 20% or less
B: more than 20%, and 60% or less
C: more than 60%

(10) Elastic Modulus in Bending (23° C.)

A shaped article obtained was cut to 3 mm×10 mm×60 mm to make a test piece.

Elastic modulus in bending of the test piece was measured according to JIS K 7171 with the use of a tensile and compression machine ("Strograph T", made in Toyo Seiki Seisaku-sho Ltd.).

Elastic modulus in bending was evaluated with the following index.

The measurement was carried out at 23° C.

The following indication is the one about the shaped article obtained from a resin composition containing 20 parts of a graft copolymer.

A: 2,300 MPa or less
B: more than 2,300 MPa, and 2,400 MPa or less
C: more than 2,400 MPa

(11) Elastic Modulus in Bending (−40° C.)

A shaped article obtained was cut to 3 mm×10 mm×60 mm to make a test piece.

Elastic modulus in bending of the test piece was measured according to JIS K 7171 with the use of a tensile and compression machine ("Strograph T", made in Toyo Seiki Seisaku-sho Ltd.).

Elastic modulus in bending was evaluated with the following index.

The measurement was carried out at −40° C.

The following indication is the one about the shaped article obtained from a resin composition containing 20 parts of a graft copolymer.

A: 2,300 MPa or less
B: more than 2,300 MPa, and 2,400 MPa or less
C: more than 2,400 MPa

(12) Dielectric Constant

A shaped article obtained was cut to 3 mm×30 mm×30 mm to make a test piece.

After moisture conditioning of the test piece at temperature of 23° C. and humidity of 50% for more than 24 hours, dielectric constant in frequency 1 GHz was measured for the above test piece with the uses of a measuring apparatus of dielectric constant ("4291B RF impedance/material analyzer", made in Agilent technologies Inc.), a dielectric constant probe ("16,453A", made in Agilent technologies Inc.) and a micrometer (made in Mitutoyo Corporation).

Dielectric constant was evaluated with the following index.

A: 2.8 or less
B: more than 2.8, and 3.0 or less
C: more than 3.0

(13) Dielectric Loss Tangent

A shaped article obtained was cut to 3 mm×30 mm×30 mm to make a test piece.

After moisture conditioning of the test piece at temperature of 23° C. and humidity of 50% for more than 24 hours, dielectric loss tangent in frequency 1 GHz was measured for the above test piece with the uses of a measuring apparatus of dielectric constant ("4291B RF impedance/material analyzer", made in Agilent technologies Inc.), a dielectric constant probe ("16,453A", made in Agilent technologies Inc.) and a micrometer (made in Mitutoyo Corporation).

Dielectric loss tangent was evaluated with the following index.

A: 0.013 or less
B: more than 0.013, and 0.016 or less
C: more than 0.016

Raw materials used in Examples and Comparative examples were shown as follows.

Di-(2-ethylhexyl)sulfosuccinic acid ammonium: "Rikasurf M-300" (trade name, made in New Japan Chemical Co., Ltd.) was used directly.
Di-(2-ethylhexyl)sulfopotassium succinate: "Pelex OT-P" (trade name, made in Kao Corporation) was used directly.
Polyoxyethylene distyrene phenyl ether: "Emulgen A-90" (trade name, made in Kao Corporation) was used directly.
Ammonium persulfate: Ammonium persulfate made in Wako Pure Chemical Industries, Ltd. was used directly.
Potassium persulfate: Potassium persulfate made in Wako Pure Chemical Industries, Ltd. was used directly.
2,2'-azobis-[N-(2-carboxyethyl)-2-methyl propione amidine]: "VA-057" (trade name, made in Wako Pure Chemical Industries, Ltd.) was used directly.
n-Butyl acrylate: n-Butyl acrylate made in Mitsubishi Chemical Corporation was used directly.
2-Ethylhexyl acrylate: 2-Ethylhexyl acrylate made in Mitsubishi Chemical Corporation was used directly.
Isooctyl acrylate: Isooctyl acrylate made in Osaka Organic Chemical Industry Ltd. was used directly.
Ally methacrylate: "Acryester A" (trade name, made in Mitsubishi Rayon Co., Ltd.) was used directly.
Methyl methacrylate: "Acryester M" (trade name, made in Mitsubishi Rayon Co., Ltd.) was used directly.

Example 1

A mixture of 4.88 parts of n-butyl acrylate, 0.12 parts of allyl methacrylate, and 92.41 parts of deionized water are prepared in a separable flask equipped with an agitator, a reflux condenser, a thermal control unit, a titration pump and a nitrogen introduction pipe, and the mixture was raised to 90° C. under agitation with 120 rpm in nitrogen atmosphere.

Then, a solution of 0.02 parts of ammonium persulfate and 8.33 parts of deionized water, which was prepared previously, was added in a lump in the separable flask, and the first step polymerization of monomer mixture (a) was carried out for 60 minutes.

Subsequently, the inside temperature of the flask was lowered to 80° C.

There was mixed with the use of a dispersion mixer 78.62 parts of 2-ethylhexyl acrylate, 1.38 parts of allyl methacrylate, 0.10 parts of 2,2'-azobis-[N-(2-carboxyethyl)-2-methyl propione amidine], 0.19 parts of di-(2-ethylhexyl)sulfosuccinic acid ammonium, 0.74 parts of polyoxyethylene distyrene phenyl ether, and 39.17 parts of deionized water.

The above emulsified mixture obtained was titrated for 230 minutes, and the second step polymerization of monomer mixture (a) was carried out for 60 minutes.

As a result, a latex of rubbery (meth)acrylate polymer (A) was obtained.

Then, there was mixed with the use of a dispersion mixer 14.33 parts of methyl methacrylate, 0.29 parts of n-butyl acrylate, 0.38 parts of allyl methacrylate, 0.03 parts of 2,2'-azobis-[N-(2-carboxyethyl)-2-methyl propione amidine], 0.10 parts of di-(2-ethylhexyl)sulfosuccinic acid ammonium, 0.20 parts of polyoxyethylene distyrene phenyl ether, and 7.50 parts of deionized water.

The above emulsified mixture obtained was titrated for 60 minutes in a latex of the rubbery (meth)acrylate polymer (A), and polymerization of monomer mixture (b) was carried out for 60 minutes.

As a result, a latex of (meth)acrylate polymer (1) was obtained.

The latex of (meth)acrylate polymer (1) obtained was powdered with the use of a spray-dryer ("L-8", made in Ohkawara Kakohki Co., Ltd.) with spray-drying treatment (atomizing method: a rotation disk method, disk rotation numbers: 25,000 rpm, inlet temperature: 140° C., outlet temperature: 65° C.).

As a result, powdery (meth)acrylate polymer (1) was obtained.

Example 2

As the second step polymerization of monomer mixture (a), there was titrated for 270 minutes an emulsified mixture of 83.54 parts of 2-ethylhexyl acrylate, 1.46 parts of allyl methacrylate, 0.12 parts of 2,2'-azobis-[N-(2-carboxyethyl)-2-methyl propione amidine], 0.20 parts of di-(2-ethylhexyl) sulfosuccinic acid ammonium, 0.79 parts of polyoxyethylene distyrene phenyl ether, and 41.67 parts of deionized water.

As polymerization of monomer mixture (b), there was used an emulsified mixture of 9.55 parts of methyl methacrylate, 0.20 parts of n-butyl acrylate, 0.25 parts of allyl methacrylate, 0.05 parts of 2,2'-azobis-[N-(2-carboxyethyl)-2-methyl propione amidine], 0.07 parts of di-(2-ethylhexyl) sulfosuccinic acid ammonium, 0.13 parts of polyoxyethylene distyrene phenyl ether, and 5.00 parts of deionized water.

Example 3

Powdery (meth)acrylate polymer (2) was obtained in the same manner as in Example 1 except that the above two polymerization conditions were adopted.

As the second step polymerization of monomer mixture (a), there was used an emulsified mixture of 88.45 parts of 2-ethylhexyl acrylate, 1.55 parts of ally methacrylate, 0.14 parts of 2,2'-azobis-[N-(2-carboxyethyl)-2-methyl propione amidine], 0.21 parts of di-(2-ethylhexyl)sulfosuccinic acid ammonium, 0.84 parts of polyoxyethylene distyrene phenyl ether, and 44.17 parts of deionized water.

As polymerization of monomer mixture (b), there was used an emulsified mixture of 4.77 parts of methyl methacrylate, 0.10 parts of n-butyl acrylate, 0.13 parts of ally methacrylate, 0.03 parts of 2,2'-azobis-[N-(2-carboxyethyl)-2-methyl propione amidine], 0.05 parts of di-(2-ethylhexyl) sulfosuccinic acid ammonium, 0.10 parts of polyoxyethylene distyrene phenyl ether, and 2.50 parts of deionized water.

Powdery (meth)acrylate polymer (3) was obtained in the same manner as in Example 1 except that the above two polymerization conditions were adopted.

Example 4

Powdery (meth)acrylate polymer (4) was obtained in the same manner as in Example 1 except that 0.001 parts of di-(2-ethylhexyl)sulfosuccinic acid ammonium was further added to a mixture which was a liquid for the first step polymerization of monomer mixture (a).

Example 5

Powdery (meth)acrylate polymer (5) was obtained in the same manner as in Example 2 except that 92.41 parts of deionized water was changed to 46.20 parts of deionized water in the composition for the first step polymerization of monomer mixture (a) and except that 44.17 parts of deionized water was changed to 87.88 parts of deionized water in the composition for the second step polymerization of monomer mixture (a).

Example 6

Powdery (meth)acrylate polymer (6) was obtained in the same manner as in Example 2 except that 2-ethylhexyl acrylate was changed to isooctyl acrylate in the composition for the second step polymerization of monomer mixture (a).

Example 7

Powdery (meth)acrylate polymer (7) was obtained in the same manner as in Example 1 except that the amount of 2-ethylhexyl acrylate was change from 78.62 parts to 79.20 parts and the amount of allyl methacrylate was change from 1.38 parts to 0.80 parts in the composition for the second step polymerization of monomer mixture (a).

Example 8

Powdery (meth)acrylate polymer (8) was obtained in the same manner as in Example 1 except that the amount of 2-ethylhexyl acrylate was change from 78.62 parts to 78.05 parts and the amount of ally methacrylate was change from 1.38 parts to 1.95 parts in the composition for the second step polymerization of monomer mixture (a).

Example 9

Powdery (meth)acrylate polymer (9) was obtained in the same manner as in Example 2 except that the emulsified mixture for polymerization of monomer mixture (b) was changed to a mixture of 9.70 parts of methyl methacrylate, 0.20 parts of n-butyl acrylate, 0.10 parts of ally methacrylate, 0.05 parts of 2,2'-azobis-[N-(2-carboxyethyl)-2-methyl propione amidine], 0.07 parts of di-(2-ethylhexyl)sulfosuccinic acid ammonium, 0.13 parts of polyoxyethylene distyrene phenyl ether, and 5.00 parts of deionized water.

Example 10

Powdery (meth)acrylate polymer (10) was obtained in the same manner as in Example 2 except that the emulsified mixture for polymerization of monomer mixture (b) was changed to a mixture of 9.31 parts of methyl methacrylate, 0.19 parts of n-butyl acrylate, 0.50 parts of allyl methacrylate, 0.05 parts of 2,2'-azobis[N-(2-carboxyethyl)-2-methyl propione amidine], 0.07 parts of di-(2-ethylhexyl)sulfosuccinic acid ammonium, 0.13 parts of polyoxyethylene distyrene phenyl ether, and 5.00 parts of deionized water.

Example 11

The amount of ammonium persulfate was changed from 0.02 parts to 0.10 parts in the composition for the first step polymerization of monomer mixture (a).

The amount of di-(2-ethylhexyl)sulfosuccinic acid ammonium was changed from 0.19 parts to 0.78 parts, and 2,2'-azobis[N-(2-carboxyethyl)-2-methyl propione amidine] and polyoxyethylene distyrene phenyl ether was not added in the composition for the second step polymerization of monomer mixture (a).

The amount of di-(2-ethylhexyl)sulfosuccinic acid ammonium was changed from 0.07 parts to 0.13 parts, and 2,2'-azobis-[N-(2-carboxyethyl)-2-methyl propione amidine] and polyoxyethylene distyrene phenyl ether was not added in the composition for polymerization of monomer mixture (b).

Powdery (meth)acrylate polymer (11) was obtained in the same manner as in Example 2 except the above conditions.

Example 12

In the composition for the first step polymerization of monomer mixture (a), 0.02 parts of ammonium persulfate was changed to 0.10 parts of potassium persulfate.

In the composition for the second step polymerization of monomer mixture (a), 0.19 parts of di-(2-ethylhexyl)sulfosuccinic acid ammonium was changed to 0.78 parts of di-(2-ethylhexyl)sulfosuccinic acid potassium, and 2,2'-azobis-[N-(2-carboxyethyl)-2-methyl propione amidine] and polyoxyethylene distyrene phenyl ether was not added.

In the composition for graft polymerization, 0.07 parts of di-(2-ethylhexyl)sulfosuccinic acid ammonium was changed to 0.13 parts of di-(2-ethylhexyl)sulfosuccinic acid potassium, and 2,2'-azobis-[N-(2-carboxyethyl]-2-methyl propione amidine] and polyoxyethylene distyrene phenyl ether was not added.

Powdery (meth)acrylate polymer (12) was obtained in the same manner as in Example 2 except the above conditions.

Comparative Example 1

Powdery (meth)acrylate polymer (1') was obtained in the same manner as in Example 1 except that the emulsified mixture in the composition for the second step polymerization of monomer mixture (a) was changed to a mixture of 73.71 parts of 2-ethylhexyl acrylate, 1.29 parts of ally methacrylate, 0.09 parts of 2,2'-azobis-[N-(2-carboxyethyl)-2-methyl propione amidine], 0.18 parts of di-(2-ethylhexyl)sulfosuccinic acid ammonium, 0.70 parts of polyoxyethylene distyrene phenyl ether and 37.50 parts of deionized water, and except that the emulsified mixture for polymerization of monomer mixture (b) was changed to a mixture of 19.11 parts of methyl methacrylate, 0.39 parts of n-butyl acrylate, 0.50 parts of allyl methacrylate, 0.03 parts of 2,2'-azobis-[N-(2-carboxyethyl)-2-methyl propione amidine], 0.13 parts of di-(2-ethylhexyl)sulfosuccinic acid ammonium, 0.25 parts of polyoxyethylene distyrene phenyl ether, and 9.12 parts of deionized water.

Comparative Example 2

Powdery (meth)acrylate polymer (2') was obtained in the same manner as in Example 2 except that 0.0025 parts of di-(2-ethylhexyl)sulfosuccinic acid ammonium was further added to a mixture which was a liquid for the first step polymerization of monomer mixture (a).

Comparative Example 3

Powdery (meth)acrylate polymer (3') was obtained in the same manner as in Example 2 except that 2-ethylhexyl acrylate was changed to n-butyl acrylate in the composition for polymerization of monomer mixture (a).

Comparative Example 4

Powdery (meth)acrylate polymer (4') was obtained in the same manner as in Example 1 except that the emulsified mixture for polymerization of monomer mixture (b) was changed to a mixture of 14.70 parts of methyl methacrylate, 0.30 parts of n-butyl acrylate, 0.03 parts of 2,2'-azobis-[N-(2-carboxyethyl)-2-methyl propione amidine], 0.10 parts of di-(2-ethylhexyl)sulfosuccinic acid ammonium, 0.20 parts of polyoxyethylene distyrene phenyl ether, and 7.50 parts of deionized water.

Comparative Example 5

Powdery (meth)acrylate polymer (5') was obtained in the same manner as in Example 2 except that the emulsified mixture for polymerization of monomer mixture (b) was changed to a mixture of 9.80 parts of methyl methacrylate, 0.20 parts of n-butyl acrylate, 0.05 parts of 2,2'-azobis-[N-(2-carboxyethyl)-2-methyl propione amidine], 0.07 parts of di-(2-ethylhexyl)sulfosuccinic acid ammonium, 0.13 parts of polyoxyethylene distyrene phenyl ether, and 5.00 parts of deionized water.

Volume average primary particle sizes, volume average secondary particle sizes, peak temperatures of tan δ, peak heights of tan δ, acetone-insoluble components, ionic contents ($Na^+$, $K^+$, $Ca^{2+}$, and $SO_4^{2-}$) of (meth)acrylate polymers (1) to (12) obtained with Examples (1) to (12) and (meth)acrylate polymers (1') to (5') obtained with Comparative examples (1) to (5) are shown in Table 1 to 6.

TABLE 1

|  |  | Example 1 | | Example 2 | | Example 3 | | Comparative example 1 | |
| --- | --- | --- | --- | --- | --- | --- | --- | --- | --- |
| (Meth)acrylate polymer | | (1) | | (2) | | (3) | | (1') | |
| Rubbery (meth)acrylate polymer (A) | Monomer mixture (a) 1st stage [part] | n-BA AMA | 4.88 0.12 | n-BA AMA | 4.88 0.12 | n-BA AMA | 4.88 0.12 | n-BA AMA | 4.88 0.12 |
| | Monomer mixture (a) 2nd stage [part] | 2-EHA AMA | 78.62 1.38 | 2-EHA AMA | 83.54 1.46 | 2-EHA AMA | 88.45 1.55 | 2-EHA AMA | 73.71 1.29 |
| Monomer mixture (b) [part] | | MMA n-BA AMA | 14.33 0.29 0.38 | MMA n-BA AMA | 9.55 0.20 0.25 | MMA n-BA AMA | 4.77 0.10 0.13 | MMA n-BA AMA | 19.11 0.39 0.50 |
| Content of (a1) in (a) [%] | | 1.8 | | 1.8 | | 1.8 | | 1.8 | |
| Ratio of (A) to (b) at the point of polymerization of (b) | Content of (A) [%] Content of (b) [%] | 85 15 | | 90 10 | | 95 5 | | 80 20 | |
| Content of (b1) in (b) [%] | | 2.5 | | 2.5 | | 2.5 | | 2.5 | |
| Volume average primary particle size [μm] | | 0.600 | | 0.590 | | 0.590 | | 0.600 | |
| Volume average secondary particle size [μm] | | 128 | | 160 | | 250 | | 130 | |
| Peak temperature of tan δ [° C.] | | −53 | | −50 | | −47 | | −56 | |
| Peak height of tan δ [—] | | 0.322 | | 0.478 | | 0.684 | | 0.295 | |
| Acetone-insoluble component [%] | | >99.9 | | >99.9 | | >99.9 | | >99.9 | |
| Increasing rate of viscosity [%] | | 3 | | 4 | | 18 | | 5 | |
| Content of ion [ppm] | $Na^+$ | <10 | | <10 | | <10 | | <10 | |
| | $K^+$ | <10 | | <10 | | <10 | | <10 | |
| | $Ca^{2+}$ | <10 | | <10 | | <10 | | <10 | |
| | $SO_4^{2-}$ | 170 | | 160 | | 150 | | 160 | |

TABLE 2

|  |  | Example 1 | | Example 4 | | Example 2 | | Example 5 | | Comparative example 2 | |
| --- | --- | --- | --- | --- | --- | --- | --- | --- | --- | --- | --- |
| (Meth)acrylate polymer | | (1) | | (4) | | (2) | | (5) | | (2') | |
| Rubbery (meth)acrylate polymer (A) | Monomer mixture (a) 1st stage [part] | n-BA AMA | 4.88 0.12 | n-BA AMA | 4.88 0.12 | n-BA AMA | 4.88 0.12 | n-BA AMA | 4.88 0.12 | n-BA AMA | 4.88 0.12 |
| | Monomer mixture (a) 2nd stage [part] | 2-EHA AMA | 78.62 1.38 | 2-EHA AMA | 78.62 1.38 | 2-EHA AMA | 83.54 1.46 | 2-EHA AMA | 83.54 1.46 | 2-EHA AMA | 83.54 1.46 |

TABLE 2-continued

|  |  | Example 1 | Example 4 | Example 2 | Example 5 | Comparative example 2 |
|---|---|---|---|---|---|---|
| Monomer mixture (b) [part] |  | MMA 14.33<br>n-BA 0.29<br>AMA 0.38 | MMA 14.33<br>n-BA 0.29<br>AMA 0.38 | MMA 9.55<br>n-BA 0.20<br>AMA 0.25 | MMA 9.55<br>n-BA 0.20<br>AMA 0.25 | MMA 9.55<br>n-BA 0.20<br>AMA 0.25 |
| Content of (a1) in (a) [%] |  | 1.8 | 1.8 | 1.8 | 1.8 | 1.8 |
| Ratio of (A) to (b) at the point of polymerization of (b) | Content of (A) [%] | 85 | 85 | 90 | 90 | 90 |
|  | Content of (b) [%] | 15 | 15 | 10 | 10 | 10 |
| Content of (b1) in (b) [%] |  | 2.5 | 2.5 | 2.5 | 2.5 | 2.5 |
| Volume average primary particle size [μm] |  | 0.600 | 0.535 | 0.590 | 0.855 | 0.495 |
| Volume average secondary particle size [μm] |  | 128 | 120 | 160 | 140 | 140 |
| Peak temperature of tan δ [° C.] |  | −53 | −55 | −50 | −49 | −50 |
| Peak height of tan δ [—] |  | 0.322 | 0.312 | 0.478 | 0.465 | 0.465 |
| Acetone-insoluble component [%] |  | >99.9 | >99.9 | >99.9 | >99.9 | >99.9 |
| Increasing rate of viscosity [%] |  | 3 | 13 | 4 | 4 | 6 |
| Content of ion [ppm] | $Na^+$ | <10 | <10 | <10 | <10 | <10 |
|  | $K^+$ | <10 | <10 | <10 | <10 | <10 |
|  | $Ca^{2+}$ | <10 | <10 | <10 | <10 | <10 |
|  | $SO_4^{2-}$ | 170 | 170 | 160 | 170 | 160 |

TABLE 3

|  |  | Example 2 | Example 6 | Comparative example 3 |
|---|---|---|---|---|
| (Meth)acrylate polymer |  | (2) | (6) | (3') |
| Rubbery (meth)acrylate polymer (A) | Monomer mixture (a) 1st stage [part] | n-BA 4.88<br>AMA 0.12 | n-BA 4.88<br>AMA 0.12 | n-BA 4.88<br>AMA 0.12 |
|  | Monomer mixture (a) 2nd stage [part] | 2-EHA 83.54<br>AMA 1.46 | 2-EHA 83.54<br>AMA 1.46 | 2-EHA 83.54<br>AMA 1.46 |
| Monomer mixture (b) [part] |  | MMA 9.55<br>n-BA 0.20<br>AMA 0.25 | MMA 9.55<br>n-BA 0.20<br>AMA 0.25 | MMA 9.55<br>n-BA 0.20<br>AMA 0.25 |
| Content of (a1) in (a) [%] |  | 1.8 | 1.8 | 1.8 |
| Ratio of (A) to (b) at the point of polymerization of (b) | Content of (A) [%] | 90 | 90 | 90 |
|  | Content of (b) [%] | 10 | 10 | 10 |
| Content of (b1) in (b) [%] |  | 2.5 | 2.5 | 2.5 |
| Volume average primary particle size [μm] |  | 0.590 | 0.600 | 0.590 |
| Volume average secondary particle size [μm] |  | 160 | 175 | 150 |
| Peak temperature of tan δ [° C.] |  | −50 | −42 | −30 |
| Peak height of tan δ [—] |  | 0.478 | 0.472 | 0.480 |
| Acetone-insoluble component [%] |  | >99.9 | >99.9 | >99.9 |
| Increasing rate of viscosity [%] |  | 4 | 4 | 3 |
| Content of ion [ppm] | $Na^+$ | <10 | <10 | <10 |
|  | $K^+$ | <10 | <10 | <10 |
|  | $Ca^{2+}$ | <10 | <10 | <10 |
|  | $SO_4^{2-}$ | 160 | 170 | 160 |

TABLE 4

|  |  | Example 1 | Example 7 | Example 8 |
|---|---|---|---|---|
| (Meth)acrylate polymer |  | (1) | (7) | (8) |
| Rubbery (meth)acrylate polymer (A) | Monomer mixture (a) 1st stage [part] | n-BA 4.88<br>AMA 0.12 | n-BA 4.88<br>AMA 0.12 | n-BA 4.88<br>AMA 0.12 |
|  | Monomer mixture (a) 2nd stage [part] | 2-EHA 78.62<br>AMA 1.38 | 2-EHA 79.2<br>AMA 0.8 | 2-EHA 78.05<br>AMA 1.95 |
| Monomer mixture (b) [part] |  | MMA 14.33<br>n-BA 0.29<br>AMA 0.38 | MMA 14.33<br>n-BA 0.29<br>AMA 0.38 | MMA 14.33<br>n-BA 0.29<br>AMA 0.38 |
| Content of (a1) in (a) [%] |  | 1.8 | 1.1 | 2.4 |
| Ratio of (A) to (b) at the point of polymerization of (b) | Content of (A) [%] | 85 | 85 | 85 |
|  | Content of (b) [%] | 15 | 15 | 15 |
| Content of (b1) in (b) [%] |  | 2.5 | 2.5 | 2.5 |
| Volume average primary particle size [μm] |  | 0.600 | 0.580 | 0.590 |
| Volume average secondary particle size [μm] |  | 128 | 150 | 120 |
| Peak temperature of tan δ [° C.] |  | −53 | −52 | −52 |
| Peak height of tan δ [—] |  | 0.322 | 0.366 | 0.305 |
| Acetone-insoluble component [%] |  | >99.9 | >99.9 | >99.9 |
| Increasing rate of viscosity [%] |  | 3 | 1 | 2 |

TABLE 4-continued

|  |  | Example 1 | Example 7 | Example 8 |
|---|---|---|---|---|
| Content of ion [ppm] | $Na^+$ | <10 | <10 | <10 |
|  | $K^+$ | <10 | <10 | <10 |
|  | $Ca^{2+}$ | <10 | <10 | <10 |
|  | $SO_4^{2-}$ | 170 | 170 | 170 |

TABLE 5

|  |  | Example 1 | | Comparative example 4 | | Example 2 | | Example 9 | | Example 10 | | Comparative example 5 | |
|---|---|---|---|---|---|---|---|---|---|---|---|---|---|
| (Meth)acrylate polymer | | (1) | | (4') | | (2) | | (9) | | (10) | | (5') | |
| Rubbery (meth)acrylate polymer (A) | Monomer mixture (a) 1st stage [part] | n-BA | 4.88 | n-BA | 4.88 | n-BA | 4.88 | n-BA | 4.88 | n-BA | 4.88 | n-BA | 4.88 |
| | | AMA | 0.12 | AMA | 0.12 | AMA | 0.12 | AMA | 0.12 | AMA | 0.12 | AMA | 0.12 |
| | Monomer mixture (a) 2nd stage [part] | 2-EHA | 78.62 | 2-EHA | 78.62 | 2-EHA | 83.54 | 2-EHA | 83.54 | 2-EHA | 83.54 | 2-EHA | 83.54 |
| | | AMA | 1.38 | AMA | 1.38 | AMA | 1.46 | AMA | 1.46 | AMA | 1.46 | AMA | 1.46 |
| Monomer mixture (b) [part] | | MMA | 14.33 | MMA | 14.7 | MMA | 9.55 | MMA | 9.7 | MMA | 9.31 | MMA | 9.80 |
| | | n-BA | 0.29 | n-BA | 0.30 | n-BA | 0.20 | n-BA | 0.20 | n-BA | 0.19 | n-BA | 0.20 |
| | | AMA | 0.38 | AMA | — | AMA | 0.25 | AMA | 0.10 | AMA | 0.50 | AMA | — |
| Content of (a1) in (a) [%] | | 1.8 | | 1.8 | | 1.8 | | 1.8 | | 1.8 | | 1.8 | |
| Ratio of (A) to (b) at the point of polymerization of (b) | Content of (A) [%] | 85 | | 85 | | 90 | | 90 | | 90 | | 90 | |
| | Content of (b) [%] | 15 | | 15 | | 10 | | 10 | | 10 | | 10 | |
| Content of (b1) in (b) [%] | | 2.5 | | 0 | | 2.5 | | 1.0 | | 5.0 | | 0 | |
| Volume average primary particle size [μm] | | 0.600 | | 0.600 | | 0.590 | | 0.600 | | 0.580 | | 0.590 | |
| Volume average secondary particle size [μm] | | 128 | | 135 | | 160 | | 180 | | 120 | | 180 | |
| Peak temperature of tan δ [° C.] | | −53 | | −55 | | −50 | | −50 | | −50 | | −50 | |
| Peak height of tan δ [—] | | 0.322 | | 0.321 | | 0.478 | | 0.470 | | 0.460 | | 0.481 | |
| Acetone-insoluble component [%] | | >99.9 | | 97.8 | | >99.9 | | >99.9 | | >99.9 | | 98.6 | |
| Increasing rate of viscosity [%] | | 3 | | 354 | | 4 | | 12 | | 4 | | 432 | |
| Content of ion [ppm] | $Na^+$ | <10 | | <10 | | <10 | | <10 | | <10 | | <10 | |
| | $K^+$ | <10 | | <10 | | <10 | | <10 | | <10 | | <10 | |
| | $Ca^{2+}$ | <10 | | <10 | | <10 | | <10 | | <10 | | <10 | |
| | $SO_4^{2-}$ | 170 | | 170 | | 160 | | 170 | | 160 | | 160 | |

TABLE 6

|  |  | Example 2 | | Example 11 | | Example 12 | |
|---|---|---|---|---|---|---|---|
| (Meth)acrylate polymer | | (2) | | (11) | | (12) | |
| Rubbery (meth)acrylate polymer (A) | Monomer mixture (a) 1st stage [part] | n-BA | 4.88 | n-BA | 4.88 | n-BA | 4.88 |
| | | AMA | 0.12 | AMA | 0.12 | AMA | 0.12 |
| | Monomer mixture (a) 2nd stage [part] | 2-EHA | 83.54 | 2-EHA | 83.54 | 2-EHA | 83.54 |
| | | AMA | 1.46 | AMA | 1.46 | AMA | 1.46 |
| Monomer mixture (b) [part] | | MMA | 9.55 | MMA | 9.55 | MMA | 9.55 |
| | | n-BA | 0.20 | n-BA | 0.20 | n-BA | 0.20 |
| | | AMA | 0.25 | AMA | 0.25 | AMA | 0.25 |
| Content of (a1) in (a) [%] | | 1.8 | | 1.8 | | 1.8 | |
| Ratio of (A) to (b) at the point of polymerization of (b) | Content of (A) [%] | 90 | | 90 | | 90 | |
| | Content of (b) [%] | 10 | | 10 | | 10 | |
| Content of (b1) in (b) [%] | | 2.5 | | 2.5 | | 2.5 | |
| Volume average primary particle size [μm] | | 0.590 | | 0.590 | | 0.590 | |
| Volume average secondary particle size [μm] | | 160 | | 165 | | 160 | |
| Peak temperature of tan δ [° C.] | | −50 | | −50 | | −50 | |
| Peak height of tan δ [—] | | 0.478 | | 0.463 | | 0.465 | |
| Acetone-insoluble component [%] | | >99.9 | | >99.9 | | >99.9 | |
| Increasing rate of viscosity [%] | | 4 | | 5 | | 5 | |
| Content of ion [ppm] | $Na^+$ | <10 | | <10 | | 360 | |
| | $K^+$ | <10 | | <10 | | 230 | |
| | $Ca^{2+}$ | <10 | | <10 | | <10 | |
| | $SO_4^{2-}$ | 160 | | 620 | | 650 | |

The abbreviations in Table 1 to 6 show the following compounds.

N-BA: n-butyl acrylate

2-EHA: 2-ethylhexyl acrylate i-OA: isooctyl acrylate

AMA: ally methacrylate

MMA: methyl methacrylate

Examples 13 to 25, Comparative Examples 6 to 11

Epoxy resins (trade name "JER828", made in Japan epoxy resin Co., Ltd.) and (meth)acrylate polymers with amounts in Table 7 to 13 were blended.

Then, kneading and defoaming for 2 minutes were carried out with the use of a spin and revolution vacuum mixer ("Thinky mixer ARV-200" (trade name), made in Thinky Corporation) under conditions of spin rotation number of 1,000 rpm, revolution rotation number of 2,000 rpm, and internal pressure of 2,666 Pa.

The mixtures obtained were passed through a three-roll mill ("M-80E", made in EXAKT Technologies, Inc., distances between rolls: each of 5 μm, rotation numbers: 200 rpm) with 3 times.

As a result, resin compositions were obtained.

Dispersibilities, initial viscosities, and storage stabilities of resin compositions obtained are shown in Table 7 to 13.

To each of the above resin compositions, an acid anhydride-based curing agent (trade name "Rika Cid MH-700", made in New Japan Chemical Co., Ltd.) as the curing agent and 2-ethyl-4-methyl imidazole (made in Shikoku Chemicals Corporation) as the accelerator with amounts in Table 7 to 13 were added.

Then, kneadings and defoamings for 2 minutes were carried out with the use of a spin and revolution vacuum mixer ("Thinky mixer ARV-200" (trade name), made in Thinky Corporation) under conditions of spin rotation number of 1,000 rpm, revolution rotation number of 2,000 rpm, and internal pressure of 2,666 Pa.

As a result, resin compositions containing the curing agent were obtained.

On the other hand, a polyethylene terephthalate film was laminated on each one side of the reinforcement glass plates of 300 mm in length, 300 mm in width and 5 mm in thickness.

A mold was prepared with sandwitching of a spacer with polytetrafluoroethylene of thickness of 3 mm between the above glass plates.

Subsequently, the resin compositions containing the curing agent obtained were poured between the glass plates, into which the spacer is interposed.

After fixing the mold with clamps, precuring at 80° C. for 2 hours was carried out and curing at 120° C. for 6 hours was carried out so that each of sheet-shaped articles was obtained.

Each of elastic moduli in bending, dielectric constants, dielectric loss tangents of the shaped articles obtained are shown in Table 7 to 13.

TABLE 7

| | | Example 13 | Example 14 | Example 15 | Comparative example 6 |
|---|---|---|---|---|---|
| Epoxy resin [part] | | 100 | 100 | 100 | 100 |
| (Meth)acrylate polymer | Kind | (1) | (2) | (3) | (1') |
| | Amount [part] | 20 | 20 | 20 | 20 |
| Dispersibility | | A <4.5 | A <4.5 | B 9.0 | A <4.5 |
| Initial viscosity [mPa · s] | | 33,760 | 32,550 | 33,920 | 32,800 |
| Storage stability | 40° C. | A 3 | A 4 | B 18 | A 5 |
| | 80° C. | B 37 | B 36 | B 48 | B 40 |
| Epoxy resin [part] | | 100 | 100 | 100 | 100 |
| (Meth)acrylate polymer | Kind | (1) | (2) | (3) | (1') |
| | Amount [part] | 20 | 20 | 20 | 20 |
| Curing agent [part] | | 85 | 85 | 85 | 85 |
| Accelerator [part] | | 1 | 1 | 1 | 1 |
| Elastic modulus in bending [Mpa] | 23° C. | B 2,340 | A 2,280 | A 2,200 | C 2,420 |
| | −40° C. | B 2,370 | A 2,290 | A 2,230 | C 2,430 |
| Dielectric constant [—] | | A 2.73 | A 2.71 | A 2.74 | A 2.75 |
| Dielectric loss tangent [—] | | A 0.011 | A 0.011 | A 0.012 | A 0.011 |
| Peak temperature of tan δ of shaped article [° C.] | | A 155 | A 156 | A 155 | A 154 |

TABLE 8

| | | Example 13 | Example 16 | Example 14 | Example 17 | Comparative example 7 |
|---|---|---|---|---|---|---|
| Epoxy resin [part] | | 100 | 100 | 100 | 100 | 100 |
| (Meth)acrylate polymer | Kind | (1) | (4) | (2) | (5) | (2') |
| | Amount [part] | 20 | 20 | 20 | 20 | 20 |
| Dispersibility | | A <4.5 | B 9.0 | A <4.5 | A <4.5 | C 10.5 |
| Initial viscosity [mPa · s] | | 33,760 | 36,550 | 32,550 | 33,520 | 31,040 |
| Storage stability | 40° C. | A 3 | B 13 | A 4 | A 4 | A 6 |
| | 80° C. | B 37 | B 45 | B 36 | B 39 | C 82 |
| Epoxy resin [part] | | 100 | 100 | 100 | 100 | 100 |
| (Meth)acrylate polymer | Kind | (1) | (4) | (2) | (5) | (2') |
| | Amount [part] | 20 | 20 | 20 | 20 | 20 |
| Curing agent [part] | | 85 | 85 | 85 | 85 | 85 |
| Accelerator [part] | | 1 | 1 | 1 | 1 | 1 |

TABLE 8-continued

|  |  | Example 13 | Example 16 | Example 14 | Example 17 | Comparative example 7 |
|---|---|---|---|---|---|---|
| Elastic modulus in bending [Mpa] | 23° C. | B 2,340 | B 2,360 | A 2,280 | A 2,260 | B 2,400 |
|  | −40° C. | B 2,370 | B 2,380 | A 2,290 | A 2,280 | B 2,390 |
| Dielectric constant [—] |  | A 2.73 | A 2.75 | A 2.71 | A 2.72 | A 2.74 |
| Dielectric loss tangent [—] |  | A 0.011 | A 0.012 | A 0.011 | A 0.011 | A 0.011 |
| Peak temperature of tan δ of shaped article [° C.] |  | A 155 | A 155 | A 156 | A 156 | A 156 |

TABLE 9

|  |  | Example 14 | Example 18 | Comparative example 8 |
|---|---|---|---|---|
| Epoxy resin [part] |  | 100 | 100 | 100 |
| (Meth)acrylate polymer | Kind | (2) | (6) | (3') |
|  | Amount [part] | 20 | 20 | 20 |
| Dispersibility |  | A <4.5 | A <4.5 | A <4.5 |
| Initial viscosity [mPa · s] |  | 32,550 | 31,580 | 33,250 |
| Storage stability | 40° C. | A 4 | A 4 | A 3 |
|  | 80° C. | B 36 | B 31 | B 30 |
| Epoxy resin [part] |  | 100 | 100 | 100 |
| (Meth)acrylate polymer | Kind | (2) | (6) | (3') |
|  | Amount [part] | 20 | 20 | 20 |
| Curing agent [part] |  | 85 | 85 | 85 |
| Accelerator [part] |  | 1 | 1 | 1 |
| Elastic modulus in bending [Mpa] | 23° C. | A 2,280 | A 2,290 | B 2,350 |
|  | −40° C. | A 2,290 | B 2,310 | C 2,640 |
| Dielectric constant [—] |  | A 2.71 | A 2.75 | A 2.74 |
| Dielectric loss tangent [—] |  | A 0.011 | A 0.011 | A 0.012 |
| Peak temperature of tan δ of shaped article [° C.] |  | A 156 | A 155 | A 156 |

TABLE 10

|  |  | Example 13 | Example 19 | Example 20 |
|---|---|---|---|---|
| Epoxy resin [part] |  | 100 | 100 | 100 |
| (Meth)acrylate polymer | Kind | (1) | (7) | (8) |
|  | Amount [part] | 20 | 20 | 20 |
| Dispersibility |  | A <4.5 | B 9.0 | A <4.5 |
| Initial viscosity [mPa · s] |  | 33,760 | 28,640 | 29,400 |
| Storage stability | 40° C. | A 3 | A 1 | A 2 |
|  | 80° C. | B 37 | B 40 | B 28 |
| Epoxy resin [part] |  | 100 | 100 | 100 |
| (Meth)acrylate polymer | Kind | (1) | (7) | (8) |
|  | Amount [part] | 20 | 20 | 20 |
| Curing agent [part] |  | 85 | 85 | 85 |
| Accelerator [part] |  | 1 | 1 | 1 |
| Elastic modulus in bending [Mpa] | 23° C. | B 2,340 | B 2,310 | B 2,360 |
|  | −40° C. | B 2,370 | B 2,370 | B 2,380 |
| Dielectric constant [—] |  | A 2.73 | A 2.74 | A 2.73 |
| Dielectric loss tangent [—] |  | A 0.011 | A 0.011 | A 0.011 |
| Peak temperature of tan δ of shaped article [° C.] |  | A 155 | A 155 | A 155 |

TABLE 11

|  |  | Example 13 | Comparative example 9 | Example 14 | Example 21 | Example 22 | Comparative example 10 |
|---|---|---|---|---|---|---|---|
| Epoxy resin [part] |  | 100 | 100 | 100 | 100 | 100 | 100 |
| (Meth)acrylate polymer | Kind | (1) | (4') | (2) | (9) | (10) | (5') |
|  | Amount [part] | 20 | 20 | 20 | 20 | 20 | 20 |
| Dispersibility |  | A <4.5 | A <4.5 | A <4.5 | B 7.5 | A <4.5 | A <4.5 |
| Initial viscosity [mPa · s] |  | 33,760 | 31,200 | 32,550 | 30,960 | 32,160 | 31,560 |
| Storage stability | 40° C. | A 3 | C 354 | A 4 | B 12 | A 4 | C 432 |
|  | 80° C. | B 37 | C >500 | B 36 | B 56 | A 10 | C >500 |
| Epoxy resin [part] |  | 100 | 100 | 100 | 100 | 100 | 100 |
| (Meth)acrylate polymer | Kind | (1) | (4') | (2) | (9) | (10) | (5') |
|  | Amount [part] | 20 | 20 | 20 | 20 | 20 | 20 |
| Curing agent [part] |  | 85 | 85 | 85 | 85 | 85 | 85 |
| Accelerator [part] |  | 1 | 1 | 1 | 1 | 1 | 1 |
| Elastic modulus in bending [Mpa] | 23° C. | B 2,340 | B 2,340 | A 2,280 | B 2,310 | A 2,300 | A 2,300 |
|  | −40° C. | B 2,370 | B 2,360 | A 2,290 | B 2,320 | B 2,320 | B 2,340 |
| Dielectric constant [—] |  | A 2.73 | A 2.74 | A 2.71 | A 2.72 | A 2.75 | A 2.76 |
| Dielectric loss tangent [—] |  | A 0.011 | A 0.012 | A 0.011 | A 0.012 | A 0.011 | A 0.011 |

TABLE 11-continued

|  | Example 13 | Comparative example 9 | Example 14 | Example 21 | Example 22 | Comparative example 10 |
|---|---|---|---|---|---|---|
| Peak temperature of tan δ of shaped article [° C.] | A 155 | A 155 | A 156 | A 156 | A 156 | A 155 |

TABLE 12

|  |  | Example 14 | Example 23 | Example 24 |
|---|---|---|---|---|
| Epoxy resin [part] |  | 100 | 100 | 100 |
| (Meth)acrylate polymer | Kind | (2) | (11) | (12) |
|  | Amount [part] | 20 | 20 | 20 |
| Dispersibility |  | A <4.5 | A <4.5 | A <4.5 |
| Initial viscosity [mPa · s] |  | 32,550 | 33,640 | 32,320 |
| Storage stability | 40° C. | A 4 | A 5 | A 5 |
|  | 80° C. | B 36 | B 39 | B 41 |
| Epoxy resin [part] |  | 100 | 100 | 100 |
| (Meth)acrylate polymer | Kind | (2) | (11) | (12) |
|  | Amount [part] | 20 | 20 | 20 |
| Curing agent [part] |  | 85 | 85 | 85 |
| Accelerator [part] |  | 1 | 1 | 1 |
| Elastic modulus in bending [Mpa] | 23° C. | A 2,280 | A 2,270 | A 2,260 |
|  | -40° C. | A 2,290 | A 2,290 | A 2,290 |
| Dielectric constant [—] |  | A 2.71 | B 2.85 | B 2.96 |
| Dielectric loss tangent [—] |  | A 0.011 | A 0.013 | B 0.015 |
| Peak temperature of tan δ of shaped article [° C.] |  | A 156 | A 155 | A 156 |

TABLE 13

|  |  | Example 14 | Example 25 | Comparative example 11 |
|---|---|---|---|---|
| Epoxy resin [part] |  | 100 | 100 | 100 |
| (Meth)acrylate polymer | Kind | (2) | (2) | — |
|  | Amount [part] | 20 | 10 | 0 |
|  |  | <4.5 | <4.5 | — |
| Initial viscosty [mPa · s] |  | 32,550 | 17,520 | 10,640 |
| Storage stability | 40° C. | 4 | 3 | 0 |
|  | 80° C. | 36 | 25 | 2 |
| Epoxy resin [part] |  | 100 | 100 | 100 |
| (Meth)acrylate polymer | Kind | (2) | (2) | — |
|  | Amount [part] | 20 | 10 | 0 |
| Curing agent [part] |  | 85 | 85 | 85 |
| Accelerator [part] |  | 1 | 1 | 1 |
| Elastic modulus in bending [Mpa] | 23° C. | 2,280 | 2,580 | 3,120 |
|  | -40° C. | 2,290 | 2,590 | 3,100 |
| Dielectric constant [—] |  | 2.71 | 2.7 | 2.70 |
| Dielectric loss tangent [—] |  | 0.011 | 0.011 | 0.011 |
| Peak temperature of tan δ of shaped article [° C.] |  | 156 | 157 | 158 |

It is apparent from Table 1 and 7 that the shaped articles obtained with the uses of compositions in which (meth) acrylate polymer (1) to (3) giving peak heights of tan δ of 0.300 or more were blended gave excellent reduction to elastic moduli, but the shaped article obtained with the use of the composition in which (meth)acrylate polymer (1') giving peak height of tan δ of less than 0.300 was blended gave inferior reduction in elastic modulus.

It is apparent from Table 2 and 8 that the resin compositions obtained with blending of (meth)acrylate polymer (1), (2), (4) and (5) having volume average primary particle sizes of 0.520 μm or more have excellent dispersibilities in the resin, and storage stabilities, but the resin composition obtained with blending of (meth)acrylate polymer (2') having a volume average primary particle size of less than 0.520 μm has inferior dispersibility in the resin, and storage stability.

It is apparent from Table 3 and 9 that the shaped articles obtained with the uses of compositions in which (meth) acrylate polymer (2) and (6) giving peak temperatures of tanδ of -40° C. or below were blended gave excellent reduction in elastic moduli, but the shaped article obtained with the use of the composition in which (meth)acrylate polymer (3') giving peak temperature of tan δ of higher than -40° C. was blended gave inferior reduction in elastic modulus.

It is apparent from Table 4 and 10 that the shaped articles obtained with the use of compositions in which (meth) acrylate polymer (1), (7) and (8) giving peak heights of tan δ of 0.300 or more were blended gave excellent reduction in elastic moduli.

It is apparent from Table 5 and 11 that the resin compositions obtained with blending of (meth)acrylate polymer (1), (2), (9) and (10) having acetone-insoluble components of 99% or more have excellent storage stabilities, but the resin composition obtained with blending of (meth)acrylate polymer (4') and (5') having acetone-insoluble components of less than 99% has inferior storage stabilities.

It is apparent from Table 6 and 12 that the shaped article obtained with the use of the composition in which (meth) acrylate polymer (2) having the content of each of metal ions of 10 ppm or less and having the content of sulfate ion of 500 ppm or less was blended gave excellent reduction in elastic modulus and insulating properties, but the shaped articles obtained with the uses of compositions in which (meth) acrylate polymer (11) and (12) having contents of each of metal ions of not 10 ppm or less and having contents of sulfate ion of not 500 ppm or less were blended gave excellent reduction in elastic moduli but gave a few inferior insulating properties.

It is apparent from Table 13 that more excellent reduction in elastic modulus was obtained as ratio of blending amount of the (meth)acrylate polymer of the present invention to the epoxy resin increased.

INDUSTRIAL APPLICABILITY

The (meth)acrylate polymer of the present invention gives excellent reduction in elastic modulus of the shaped article which is obtained with blending of the (meth)acrylate polymer of the present invention, so that the (meth)acrylate polymer of the present invention is useful as an additive for a resin having stress relaxation properties, specifically as an additive for an epoxy resin having stress relaxation properties.

In addition, the resin composition and the shaped article which are obtained with blending of the (meth)acrylate polymer of the present invention can be used for various applications such as electronic materials, and can be used specifically for applications, such as semiconductors and adhesives, which require reduction in elastic moduli.

It is noted that the application concerned insists on priority based on Japanese Patent Application No. 2009-56,122 filed on Mar. 10, 2009 and Japanese Patent Application No. 2009-248,931 filed on Oct. 29, 2009, and the subject matters are incorporated herein by reference.

The invention claimed is:

1. A resin composition comprising:
   100 parts by mass of a curable resin; and
   0.1 to 50 parts by mass of a (meth)acrylate polymer having the following properties: a volume average primary particle size of 0.520 to 3.00 μm; a peak temperature of tan δ in the range of −100 to 0° C., determined with dynamic viscoelasticity measurement, of −40° C. or below; a peak height of tan δ in the range of −100 to 0° C., determined with dynamic viscoelasticity measurement, of 0.300 or more; and an acetone-insoluble component of 99% by mass or more;
   wherein the (meth)acrylate polymer contains 81 to 98% by mass of a rubbery (meth)acrylate polymer (A) having a glass transition temperature of −40° C. or below and 2 to 19% by mass of a polymerized monomer mixture (b), which is polymerized in the presence of said rubbery (meth)acrylate polymer (A), totaling 100% by mass;
   said rubbery (meth)acrylate polymer (A) is obtained by polymerizing a monomer mixture (a) comprising 0.0001 to 2.5% by mass of a cross-linkable monomer (a1) and 69.999 to 99.999% by mass of a (meth)acrylate monomer (a2) capable of giving a homopolymer having a glass transition temperature of −40° C. or below, based on 100% by mass of monomer mixture (a); and
   said monomer mixture (b) comprises 0.1% by mass or more of a cross-linkable monomer (b1) and 99.9% by mass or less of a vinyl monomer (b2), based on 100% by mass of monomer mixture (b).

2. The resin composition according to claim 1, wherein the curable resin is an epoxy resin.

3. The resin composition according to claim 2, further comprising a curing agent.

4. The resin composition according to claim 1, further comprising a curing agent.

5. A shaped article obtained with shaping of the resin composition according to claim 1.

6. A sealing material for semiconductors comprising:
   100 parts by mass of a curable resin; and
   0.1 to 50 parts by mass of a (meth)acrylate polymer having the following properties: a volume average primary particle size of 0.520 to 3.00 μm; a peak temperature of tan δ in the range of −100 to 0° C., determined with dynamic viscoelasticity measurement, of −40° C. or below; a peak height of tan δ in the range of −100 to 0° C., determined with dynamic viscoelasticity measurement, of 0.300 or more; and an acetone-insoluble component of 99% by mass or more;
   wherein the (meth)acrylate polymer contains 81 to 98% by mass of a rubbery (meth)acrylate polymer (A) having a glass transition temperature of −40° C. or below and 2 to 19% by mass of a polymerized monomer mixture (b), which is polymerized in the presence of said rubbery (meth)acrylate polymer (A), totaling 100% by mass;
   said rubbery (meth)acrylate polymer (A) is obtained by polymerizing a monomer mixture (a) comprising 0.0001 to 2.5% by mass of a cross-linkable monomer (a1) and 69.999 to 99.999% by mass of a (meth)acrylate monomer (a2) capable of giving a homopolymer having a glass transition temperature of −40° C. or below, based on 100% by mass of monomer mixture (a); and
   said monomer mixture (b) comprises 0.1% by mass or more of a cross-linkable monomer (b1) and 99.9% by mass or less of a vinyl monomer (b2), based on 100% by mass of monomer mixture (b).

7. The sealing material according to claim 6, wherein said curable resin is an epoxy resin.

8. The sealing material according to claim 6, further comprising a curing agent.

9. An adhesive comprising:
   100 parts by mass of a curable resin; and
   0.1 to 50 parts by mass of a (meth)acrylate polymer having the following properties: a volume average primary particle size of 0.520 to 3.00 μm; a peak temperature of tan δ in the range of −100 to 0° C., determined with dynamic viscoelasticity measurement, of −40° C. or below; a peak height of tan δ in the range of −100 to 0° C., determined with dynamic viscoelasticity measurement, of 0.300 or more; and an acetone-insoluble component of 99% by mass or more;
   wherein the (meth)acrylate polymer contains 81 to 98% by mass of a rubbery (meth)acrylate polymer (A) having a glass transition temperature of −40° C. or below and 2 to 19% by mass of a polymerized monomer mixture (b), which is polymerized in the presence of said rubbery (meth)acrylate polymer (A), totaling 100% by mass;
   said rubbery (meth)acrylate polymer (A) is obtained by polymerizing a monomer mixture (a) comprising 0.0001 to 2.5% by mass of a cross-linkable monomer (a1) and 69.999 to 99.999% by mass of a (meth)acrylate monomer (a2) capable of giving a homopolymer having a glass transition temperature of −40° C. or below, based on 100% by mass of monomer mixture (a); and
   said monomer mixture (b) comprises 0.1% by mass or more of a cross-linkable monomer (b1) and 99.9% by mass or less of a vinyl monomer (b2), based on 100% by mass of monomer mixture (b).

10. The adhesive according to claim 9, wherein said curable resin is an epoxy resin.

11. The adhesive according to claim 9, further comprising a curing agent.

* * * * *